United States Patent
Kanai et al.

(10) Patent No.: US 6,587,380 B2
(45) Date of Patent: *Jul. 1, 2003

(54) PROGRAMMING METHOD FOR NON-VOLATILE SEMICONDUCTOR MEMORY DEVICE

(75) Inventors: Masahiro Kanai, Suwa (JP); Teruhiko Kamei, Yokohama (JP)

(73) Assignees: Seiko Epson Corporation, Tokyo (JP); Halo LSI Design & Device Technology, Inc., Wappingers Falls, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/955,158

(22) Filed: Sep. 19, 2001

(65) Prior Publication Data

US 2003/0002343 A1 Jan. 2, 2003

(30) Foreign Application Priority Data

May 11, 2001 (JP) ........................................ 2001-141616

(51) Int. Cl.[7] .............................................. G11C 16/04
(52) U.S. Cl. ........................... 365/185.28; 365/185.18; 365/185.05
(58) Field of Search ...................... 365/185.18, 185.28, 365/185.05

(56) References Cited

U.S. PATENT DOCUMENTS

| | | |
|---|---|---|
| 5,408,115 A | 4/1995 | Chang |
| 5,422,504 A | 6/1995 | Chang et al. |
| 5,494,838 A | 2/1996 | Chang et al. |
| 5,969,383 A | 10/1999 | Chang et al. |
| 6,177,318 B1 | 1/2001 | Ogura et al. |
| 6,248,633 B1 | 6/2001 | Ogura et al. |
| 6,255,166 B1 | 7/2001 | Ogura et al. |
| 2002/0067641 A1 * | 6/2002 | Ogura et al. ........... 365/185.29 |

FOREIGN PATENT DOCUMENTS

| | | |
|---|---|---|
| JP | 7-161851 | 6/1995 |
| JP | 2978477 | 9/1999 |
| JP | 2001-156188 | 6/2001 |

OTHER PUBLICATIONS

Yutaka Hayashi et al., "Twin MONOS Cell with Dual Control Gates", IEEE VLSI Technology Digest, 2000.

Kuo–Tung Chang et al., "A New SONOS Memory Using Source–Side Injection for programming", IEEE Electron Device Letters, pp. 253–255, vol. 19, No. 7, Jul. 1998.

Wei–Ming Chen et al., "A Novel Flash Memory Device with S Plit Gate Source Side Injection and ONO Charge Storage Stack (SPIN)", VLSI Technology Digest, pp. 63–64, 1997.

* cited by examiner

Primary Examiner—Huan Hoang
(74) Attorney, Agent, or Firm—Oliff & Berridge, PLC

(57) ABSTRACT

A method is provided for programming data for a memory element of a twin memory cell (i). The word line WL1 is set to a programming word line selection voltage, the control gate CG[i+1] is set to a programming control gate voltage, the control gate CG[i] is set to an over-ride voltage, the bit line BL[i+1] is set to a programming bit line voltage, and the bit line BL[i] is connected to the constant current source.

6 Claims, 23 Drawing Sheets

To Sense Amplifier, Bit Line Driver

Erase (Opposite Block)

Erase (Unselected Block)

PROGRAMMING METHOD FOR NON-VOLATILE SEMICONDUCTOR MEMORY DEVICE

Japanese Patent Application No. 2001-141616, filed May 11, 2001, is hereby incorporated by reference in its entirety.

1. Technical Field

The present invention relates to a programming method for a non-volatile semiconductor memory device formed from twin memory cells each being equipped with one word gate and two non-volatile memory elements controlled by two control gates.

2. Background

There is known a MONOS (Metal-Oxide-Nitride-Oxide-semiconductor or -substrate) type non-volatile semiconductor device in which a gate dielectric layer between a channel and a gate is formed from a stacked body including a silicon oxide film, a silicon nitride film, and a silicon oxide film, and charge is trapped in the silicon nitride film.

A MONOS type non-volatile semiconductor memory device is described in a reference (Y. Hayashi, et al. 2000 Symposium on VLSI Technology, Digest of Technical Papers, p. 122–p. 123). The reference describes a twin MONOS flash memory cell equipped with one word gate and two non-volatile memory elements (MONOS memory elements) controlled by two control gates. In other words, one flash memory cell includes two charge trap sites.

A plurality of twin MONOS flash memory cells each having the structure described above are arranged in the row direction and the column direction in multiple rows and columns to form a memory cell array region.

Two bit lines, one word line, and two control gate lines are required to drive a MONOS flash memory cell. However, when driving a plurality of twin memory cells, these lines can be commonly connected for different control gates if they are set at the same potential.

Operations of this type of flash memory include erasing, programming, and reading data. Normally, data programming or data reading is performed at selected cells in units of 8 bits or 16 bits simultaneously.

It is noted that, in the MONOS flash memory, a plurality of twin MONOS flash memory cells that are not mutually isolated are connected to one word line. For programming data at a specified selected cell (selected non-volatile memory element), not only must the voltage of a twin MONOS flash memory including the selected cell be appropriately set, but also the voltage of an adjacent twin MONOS flash memory cell must be appropriately set.

SUMMARY

Therefore, it is an object of the present invention to provide a programming method for a non-volatile semiconductor memory device, in which, when data is programmed at a selected cell, voltages are appropriately set for a twin memory cell including the selected cell and an adjacent twin memory cell such that data can be reliably programmed at the selected cell.

In accordance with one embodiment of the present invention, a programming method in which a plurality of twin memory cells, each having one word gate and first and second non-volatile memory elements controlled by first and second control gates, are arranged and, from among three adjacent twin memory cells (i−1), (i), and (i+1) whose word gates are connected to one word line, data for the second non-volatile memory element of the twin memory cell (i) is programmed, comprises:

setting the word line to a programming word line selection voltage;

setting the second control gate of the twin memory cell (i) and the first control gate of the twin memory cell (i+1) to a programming control gate voltage;

setting the second control gate of the twin memory cell (i−1) and the first control gate of the twin memory cell (i) to an over-ride voltage;

setting a bit line commonly connected to the second non-volatile memory element of the twin memory cell (i) and the first non-volatile memory element of the twin memory cell (i+1) to a programming bit line voltage; and connecting a bit line that is commonly connected to the second non-volatile memory element of the twin memory cell (i−1) and the first non-volatile memory element of the twin memory cell (i) to a constant current source.

In accordance with another embodiment of the present invention, a programming method in which a plurality of twin memory cells, each having one word gate and first and second non-volatile memory elements controlled by first and second control gates, are arranged and, from among three adjacent twin memory cells (i−1), (i), and (i+1) whose word gates are connected to one word line, data for the first non-volatile memory element of the twin memory cell (i) is programmed, comprises:

setting the word line to a programming word line selection voltage;

setting the second control gate of the twin memory cell (i−1) and the first control gate of the twin memory cell (i) to a programming control gate voltage;

setting the second control gate of the twin memory cell (i) and the first control gate of the twin memory cell (i+1) to an over-ride voltage;

setting a bit line commonly connected to the second non-volatile memory element of the twin memory cell (i−1) and the first non-volatile memory element of the twin memory cell (i) to a programming bit line voltage; and connecting a bit line that is commonly connected to the second non-volatile memory element of the twin memory cell (i) and the first non-volatile memory element of the twin memory cell (i+1) to a constant current source.

In both of the embodiments described above, current that flows in the bit line at the time of programming is restricted by the constant current source, such that the voltage for the bit line can be properly set and the programming operation can be securely performed.

It is noted that the programming word line selection voltage may preferably be set to a voltage that is high enough to be able to cause a current greater than a current provided by the constant current source to flow between a source and a drain (between bit lines) of the selected twin memory cell. As a result, the current that flows in the bit line during programming is also restricted at a constant level by the constant current source, such that the voltage for the bit line can be properly set and the programming operation can be securely performed.

Each of the first and second non-volatile memory elements may include an ONO film formed from an oxide film (O), a nitride film (N), and an oxide film (O), which can be used as a charge trap site, but can have any other structure without being restricted to the structure described above.

DETAILED DESCRIPTION

Embodiments of the present invention are described with reference to the accompanying drawings.

(Twin Memory Cell Structure)

Figure 1:
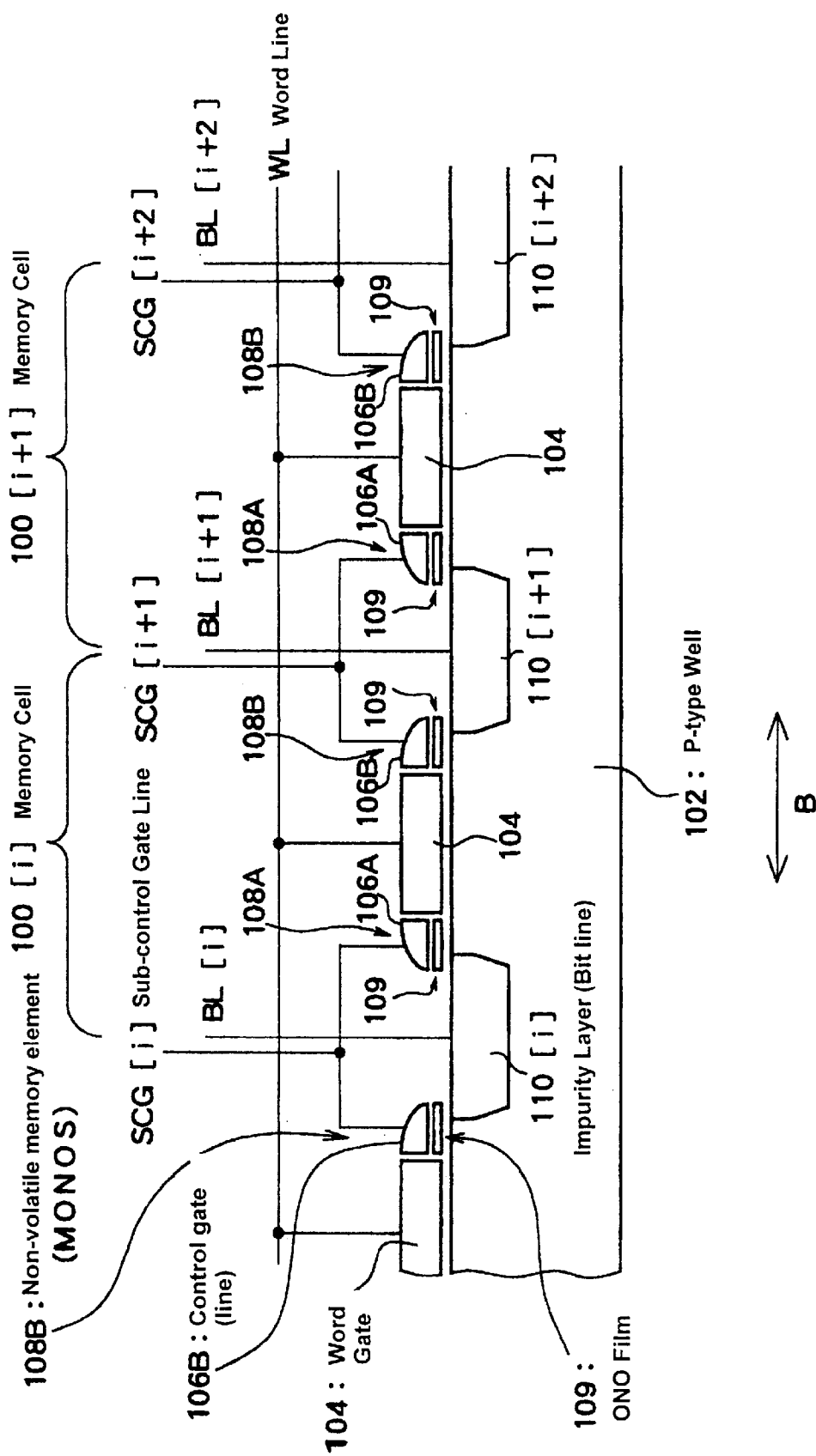
FIG. 1 shows a cross section of a non-volatile semiconductor memory device in accordance with one embodiment of the present invention.

FIG. I shows a cross section of a non-volatile semiconductor memory device. In FIG. 1, one twin memory cell 100 includes a word gate 104 formed from a material including, for example, polycrystal silicon on a P-type well 102 with a gate oxide film therebetween, first and second control gates 106A and 106B, and first and second memory elements (MONOS memory elements) 108A and 108B.

The first and second control gates 106A and 106B are formed on both walls of the word gate 104, and are electrically insulated from the word gate 104.

Each of the first and second memory elements 108A and 108B is formed by stacking layers of anoxide film (O), anitride film (N), and an oxide film (O) between one of the first and second control gates 106A and 106B that is formed from polycrystal silicon corresponding to the M (metal) of MONOS and the P-type well 102. It is noted that the first and second control gates 106A and 106B can be formed from a conductive material such as silicide.

In this manner, one twin memory cell 100 has the first and second MONOS memory elements 108A and 108B equipped with split gates (the first and second control gates 106A and 106B) and the first and second MONOS memory elements 108A and 108B commonly use one word gate 104.

Each of the first and second MONOS memory elements 108A and 108B functions as a charge trap site. Each of the first and second MONOS memory elements 108A and 108B is capable of trapping charge at the ONO film 109.

As shown in FIG. 1, a plurality of the word gates 104 are arranged at intervals in the row direction (a second direction B in FIG. 1) and are commonly connected to one word line WL that is formed from polycide.

Also, the control gates 106A and 106B shown in FIG. 1 extend in the column direction (a first direction A perpendicular to the sheet surface of FIG. 1), and are commonly used by a plurality of the twin memory cells 100 that are arranged in the column direction. Accordingly, the elements 106A and 106B may also be referred to as control gate lines.

Here, the control gate 106B of the [i]-th twin memory cell 100[i] and the control gate 106A of the [i+1]-th twin memory cell 100[i+1] are connected to a sub-control gate line SCG [i+1] that is formed from a metal layer provided above, for example, the word gate, the control gates, and the word lines.

An [i+1]-th impurity layer 110[i+1] that is commonly used by the MONOS memory element 108B of the [i]-th twin memory cell 100[i] and the MONOS memory element 108A of the [i+1]-th twin memory cell 100[i+1] is provided in the P-type well 102.

The impurity layers 110[i], [i+1] and [i+2] are, for example, n-type impurity layers formed in a P-type well, extend in the column direction (in the first direction A perpendicular to the sheet surface of FIG. 1) and function as bit lines that are commonly used by the plurality of twin memory cells 100 that are arranged in the column direction. Accordingly, the elements 110[i] , [i+1] and [i+2] are also referred to as bit lines BL[i], [i+1] and [i+2].

(Overall Structure of Non-volatile Semiconductor Memory Device)

The overall structure of a non-volatile semiconductor memory device that is formed using the above-described twin memory cells 100 is described with reference to FIGS. 2A through 2E.

Figure 2A:
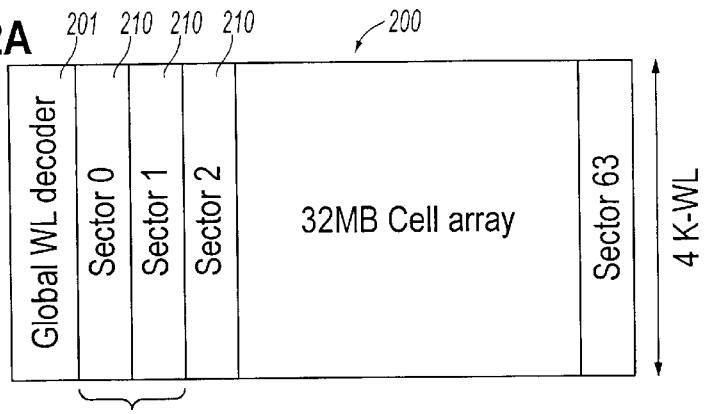
FIG. 2A shows a plan layout of the non-volatile semiconductor memory device shown in FIG. 1.

FIG. 2A shows aplan layout of a single-chip non-volatile semiconductor memory device that includes a memory cell array region 200 and a global word line decoder 201. The memory cell array region 200 includes, for example, a total of sixty-four sector regions 210, namely 0th to 63rd sector regions.

The sixty-four sector regions 210 are obtained by dividing the memory cell array region 200 in the second direction (row direction) B, as shown in FIG. 2A. Each of the sector regions 210 has a longitudinal rectangular shape with its longitudinal direction being in the first direction (column direction) A. The minimum unit for erasing data is the sector region 210, and data stored in the sector region 210 is erased in one lot or in a time-division manner.

The memory cell array region 200 includes, for example, 4K word lines WL and 4K bit lines BL. In accordance with the present embodiment, two MONOS memory elements 108A and 108B are connected to one bit line BL. Therefore, 4K bit lines BL means a memory capacity of 8 Kbits. Each of the sector regions 210 has a memory capacity that is one sixty-fourth (1/64) of the memory capacity of the entire memory, and a memory capacity defined by (4K word lines WL)×(64 bit lines BL)×2.

Figure 2B:
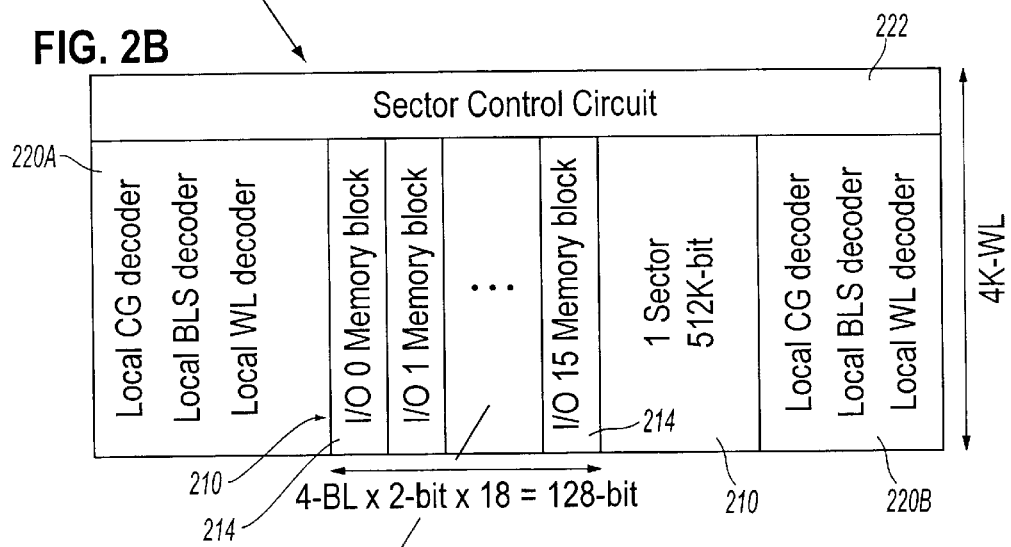
FIG. 2B shows a plan view of two sector regions in FIG. 2A.

FIG. 2B shows in detail two adjacent ones (0th and 1st) of the sector regions 210 in the non-volatile semiconductor memory device shown in FIG. 2A. As shown in FIG. 2B, local drivers 220A and 220B (each including a local control gate driver, a local bit line selection driver and a local word line driver) are disposed on both sides of the two sectors 210. Also, a sector control circuit 222 is disposed at, for example, an upper side of the two sectors 210 and the two local drivers 220A and 220B.

Each of the sector regions 210 is divided in the second direction such that each has sixteen memory blocks (memory blocks corresponding to input/output bits) for I/O0 to I/O15 that enable reading and writing 16-bit data. Each of the memory blocks 214 has 4K (4096) word lines WL, as shown in FIG. 2B.

Figure 2C:
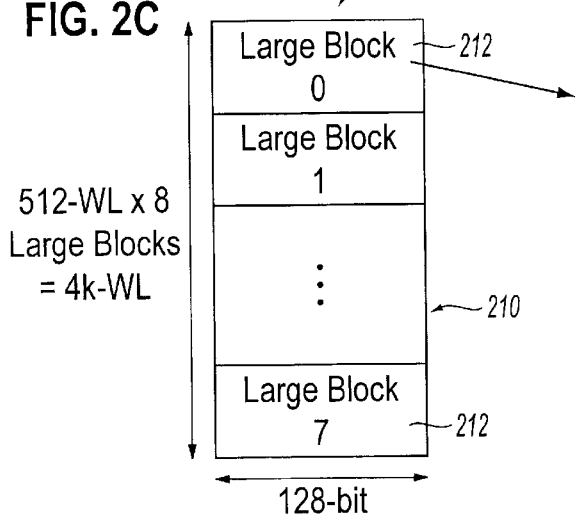
FIG. 2C shows a plan view of one memory block in FIG. 2B.
Figure 2D:
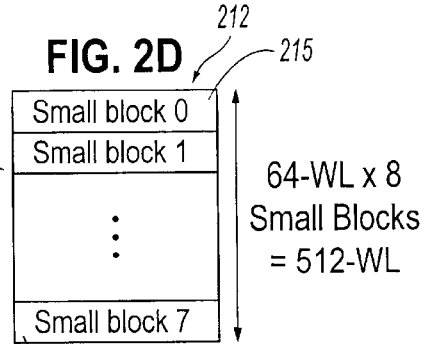
FIG. 2D shows a plan view of one large block in FIG. 2C.

As shown in FIG. 2C, each one of the sector regions 210 shown in FIG. 2B is divided in the first direction A into eight large blocks 212. Each of the large blocks 212 is divided in the first direction A into eight small blocks 215, as shown in FIG. 2D.

Figure 2E:
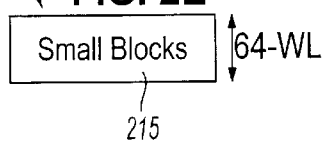
FIG. 2E shows a plan view of one small block in FIG. 2D.

Each of the small blocks 215 has sixty-four word lines WL, as shown in FIG. 2E.

(Details of Sector Region)

Figure 3:
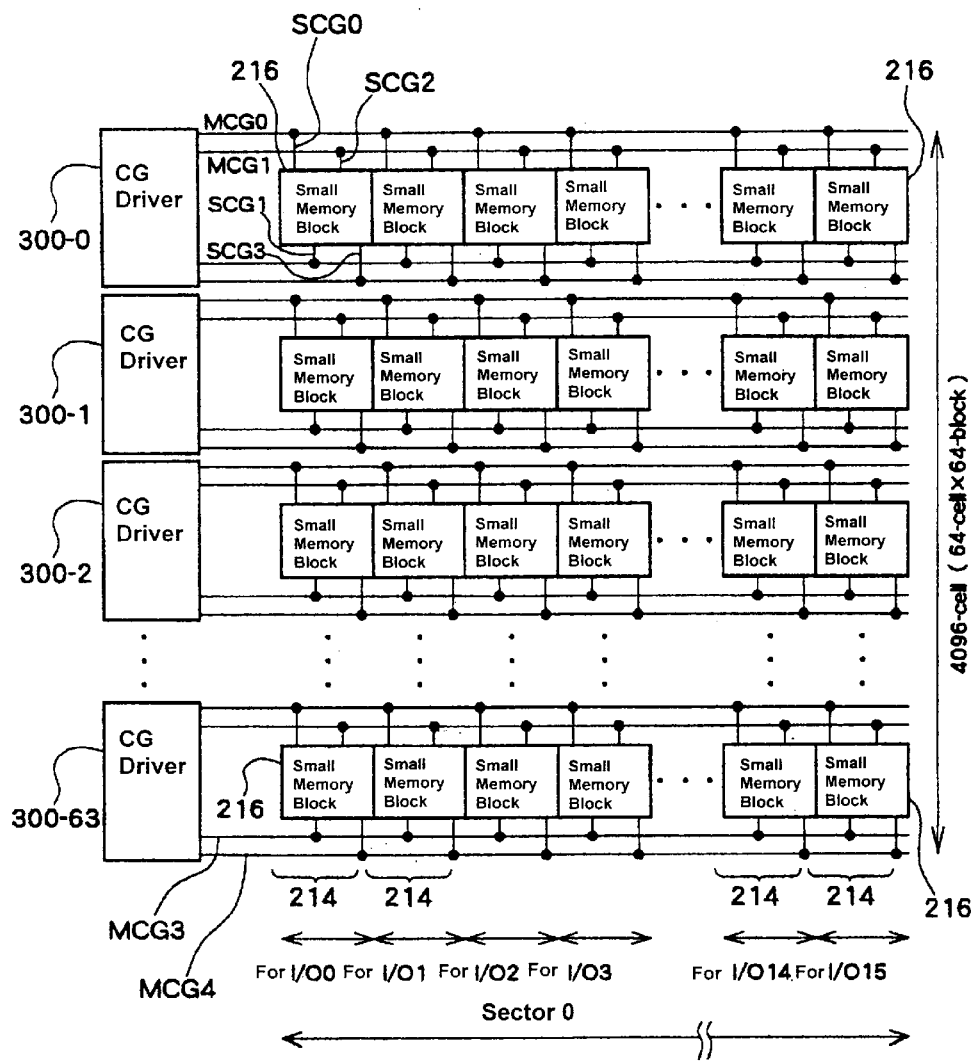
FIG. 3 schematically shows an illustration to be used to describe many small memory blocks and their wirings in one sector region shown in FIG. 2B.
Figure 4:
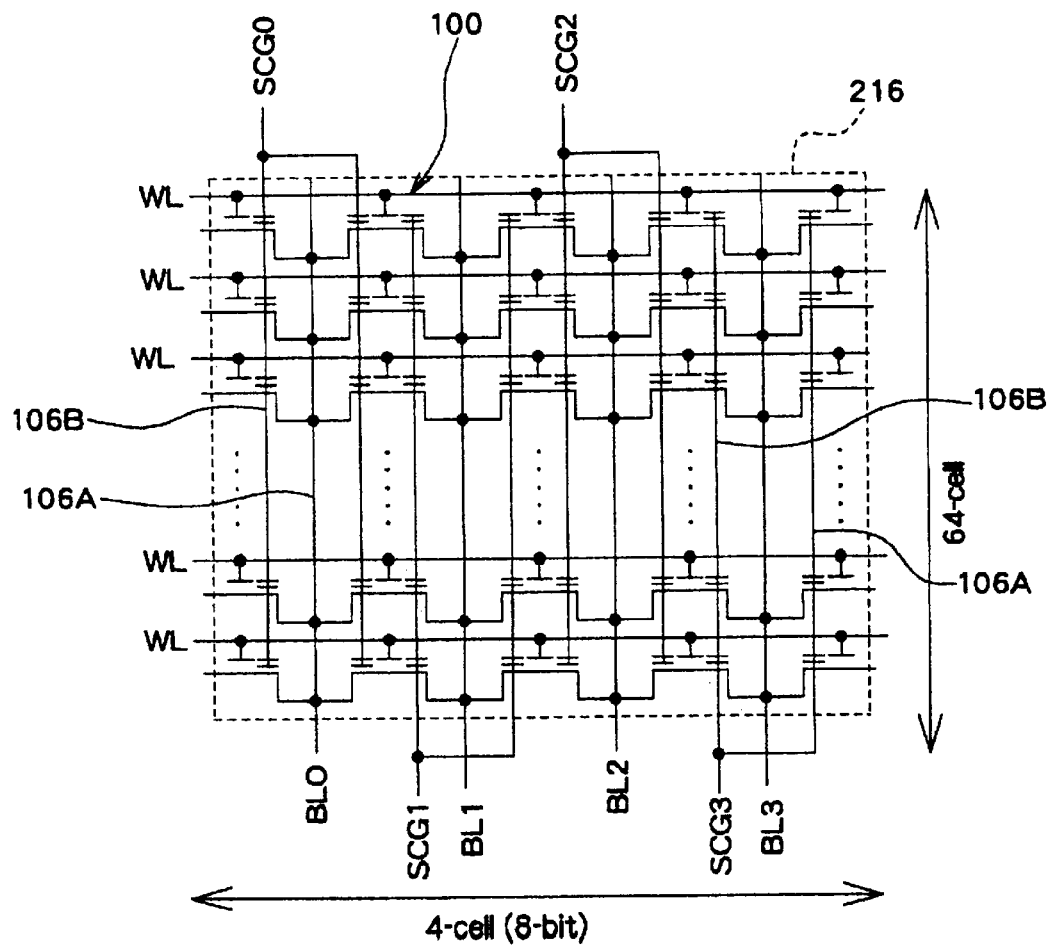
FIG. 4 shows a circuit diagram of a small memory block shown in FIG. 3.

FIG. 3 shows in detail the sector region 0 shown in FIG. 2A. As shown in FIG. 4, the small memory block 216 shown in FIG. 3 includes the twin memory cells 100 arranged in a matrix of, for example, sixty four in the column direction and, for example, four in the row direction. Each one of the small memory blocks 216 is connected to, for example, four sub-control gate lines SCG0 to SCG3, four bit lines BL0 to BL3 that are data input and output lines, and sixty-four word lines WL.

Here, the even numbered sub-control gate lines SCG0 and SCG2 are commonly connected to the second control gates 106B of the plurality of twin memory cells in an even numbered column (the 0th column or the 2nd column) and the first control gates 106A of the plural twin memory cells in an odd numbered column (the 1st column or the 3rd column), respectively. Similarly, the odd numbered sub-control gate lines SCG1 and SCG3 are commonly connected to the second control gates 106B of the plurality of twin memory cells in an odd numbered column (the 1st column or the 3rd column) and the first control gates 106A of the plural twin memory cells in an odd numbered column (the 2nd column or the 4th column), respectively.

As shown in FIG. 3, sixty-four small memory blocks 216 are arranged in the column direction in each one of the memory blocks 214, and sixteen memory blocks 214 corresponding to sixteen I/O0 to I/O15 are arranged in the row direction for input and output of 16 bits.

Sixteen sub-control gate lines SCG0 of the sixteen small memory blocks 216 arranged in the row direction are commonly connected to a main control gate line MCG0 along the row direction. Similarly, sixteen sub-control gate lines SCG1 are commonly connected to a main control gate line MCG1, sixteen sub-control gate lines SCG2 are commonly connected to a main control gate line MCG2, and sixteen sub-control gate lines SCG3 are commonly connected to a main control gate line MCG3.

CG drivers 300-0 to 300-63, which are control gate driving sections for the sector region 0, are provided. The CG drivers 300 are connected to the four main control gate lines MCG0 to MCG3 that extend in the row direction.

Figure 5:
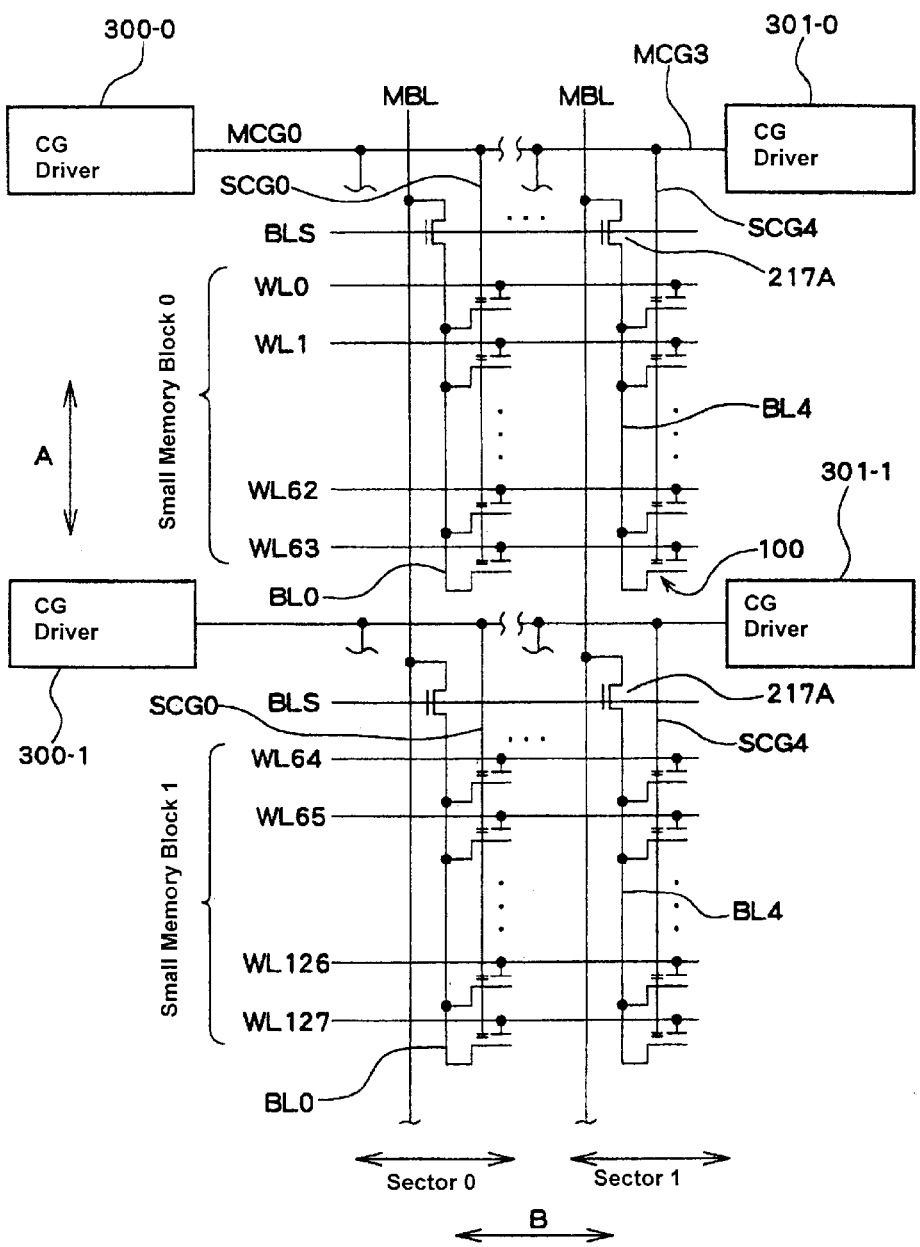
FIG. 5 shows a circuit diagram illustrating the relation between small memory blocks and control gate drivers shown in FIG. 3.

FIG. 5 shows the relation between the sector region 0 and the sector region 1 that are mutually adjacent to each other, The sector region 0 and the sector region 1 commonly use the word line WL, but are provided with the main control gate line MCG and the main bit line MBL independently from one another. In particular, FIG. 5 shows the CG drivers 300-0 and 300-1 corresponding to the sector region 0, and the CG drivers 301-0 and 301-1 corresponding to the sector region 1, in which the CG drivers are independently provided for each of the sector regions.

Each of the bit lines BL0 (an impurity layer) disposed for each of the small memory blocks 216 is commonly connected to the main bit line MBL that is a metal wiring. The main bit line MBL is commonly used by the small memory blocks arranged in the column direction. A bit line selection gate 217A is disposed in a path from the main bit line MBL to each bit line BL0 in each of the small memory blocks. It is noted that the bit line selection gates 217A are connected to the corresponding even numbered bit lines BL0, BL2, BL4, . . . , while bit line selection gates 217B. although omitted in FIG. 5, are connected to the odd numbered bit lines BL1, BL3, BL5, . . . (see FIG. 10 and FIG. 15).

Figure 6:
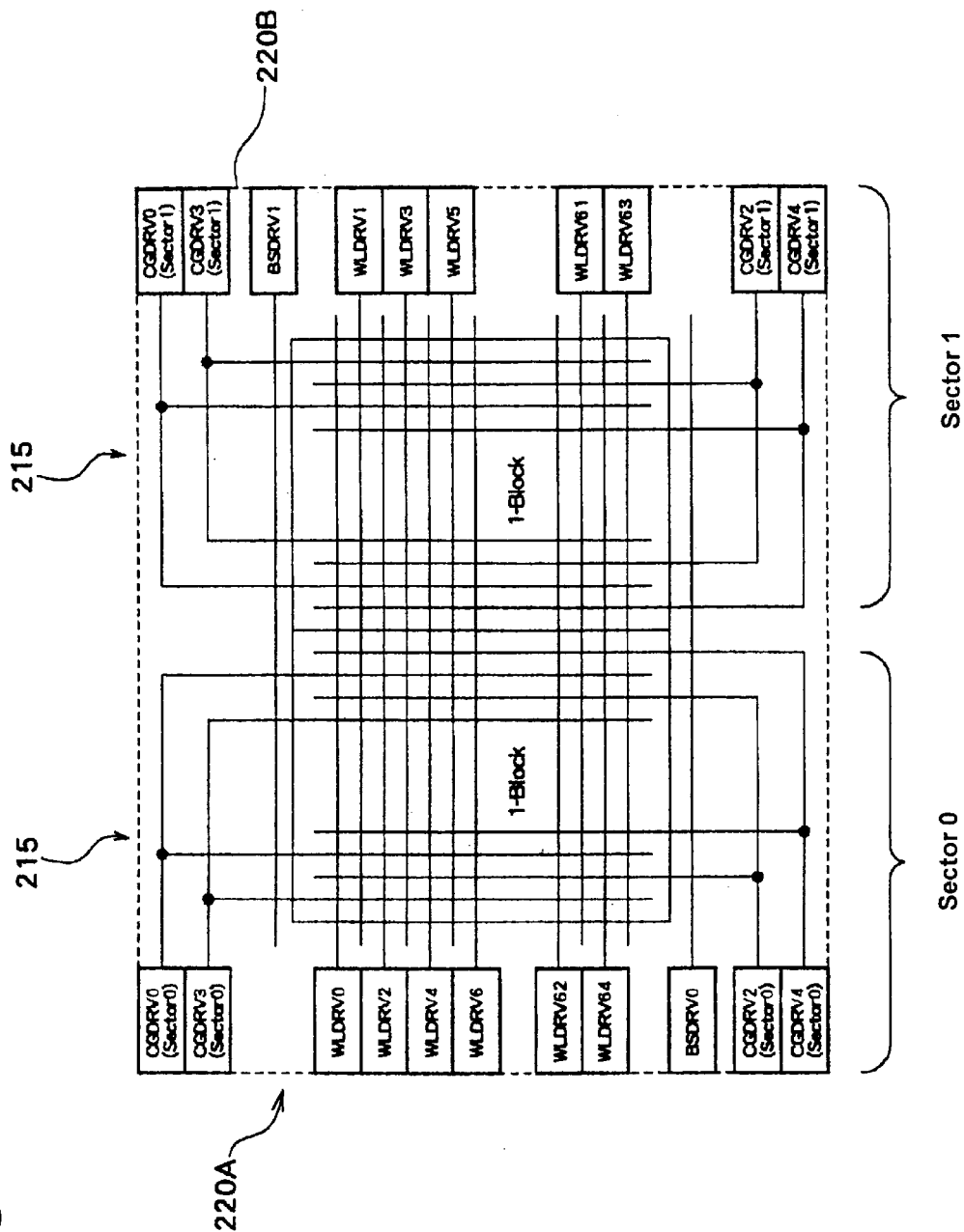
FIG. 6 schematically shows an illustration to be used to describe the relation between two memory blocks and local drivers in two adjacent sectors.

Two small blocks 215 in the 0th and 1st sector regions 210 that are adjacent to one another and the local drivers 220A and 220B on both sides thereof are shown in detail in FIG. 6. As shown in FIG. 6, four local control gate line drivers CGDRV0 to CGDRV3 corresponding to the CG drivers 300 shown in FIGS. 3 and 5 are provided in the local driver 220A on the left side. Similarly, four local control gate line drivers CGDRV0 to CGDRV3 corresponding to the CG drivers 301 shown in FIG. 5 are provided in the local driver 220B on the right side Also, local word line drivers WLDRV0, WLDRV2, . . . , WLDRV62 for driving even numbered word lines WL0, 2, . . . , 62 in the sectors 0 and 1, and WLDRVR0 for driving one redundant word line in the sector 0 are disposed in the local driver 220A on the left. Local word line drivers WLDRV1, WLDRV3, . . . , WLDRV63 for driving odd numbered word lines WL1, 3, . . . , 63 in the sectors 0 and 1, and WLDRVR1 for driving one redundant word line in the sector 1 are disposed in the local driver 220A on the right.

Furthermore, a local bit line driver BSRV0 for driving the bit line selection gate 217A connected to, for example, the even numbered bit lines BL0 and BL2 in the sectors 0 and 1 is disposed in the local driver 220A on the left side. A local bit line driver BSRV1 for driving the bit line selection gate 217B connected to, for example, the odd numbered bit lines BL1 and BL3 in the sectors 0 and 1 is disposed in the local driver 220B on the right side.

(Description of Operation)

Data reading, data programming, and data erasing operations in a non-volatile semiconductor memory device in accordance with one embodiment of the present invention are described below.

Figure 7:
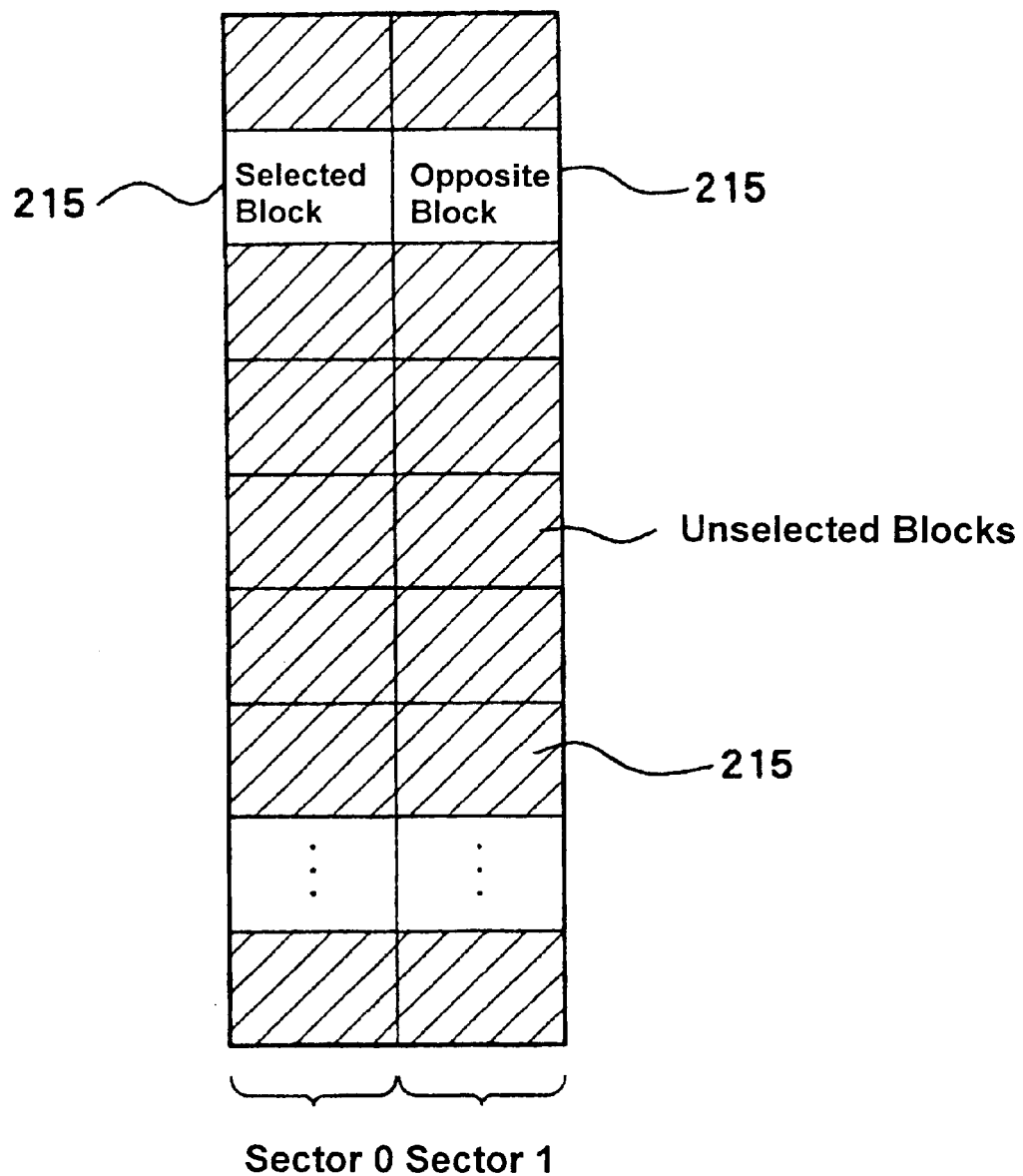
FIG. 7 schematically shows an illustration to be used to describe a selected block an unselected opposite block opposing thereto, and other unselected blocks.

In the description below, terms such as selected block (selected Block), unselected opposite block (Opposite Block) and unselected block (Unselected Block) are used. They refer to the small blocks 215 by different names. As shown in FIG. 7, for example, in a pair of the sectors 0 and 1, the selected block means, for example, one small block 215 that is selected in the sector 0. The unselected opposite block is a small block 215 in the sector 1 adjacent to the sector 0, and means a small block 215 that is adjacent to the selected block. The unselected block means all of the small blocks 215 other than the selected block and the opposite block in the sectors 0 and 1 (including the sectors 2 to 63).

Also, when reading or programming, there are selected cells (Selected Cell: selected twin memory cell 100) and unselected cells (Unselected Cell: unselected twin memory cell 100) present in a selected block. Furthermore, there is a memory element 108A or 108B on a selected side (Selected Side), and a memory element 108A or 108B on an opposite side (Opposite Side) in a selected cell.

Under the definitions given above, potentials on the control gate line CG, bit line BL, and word line WL at the time of reading, programming, and erasing are shown in Table 1 and Table 2 below.

Figure 9:
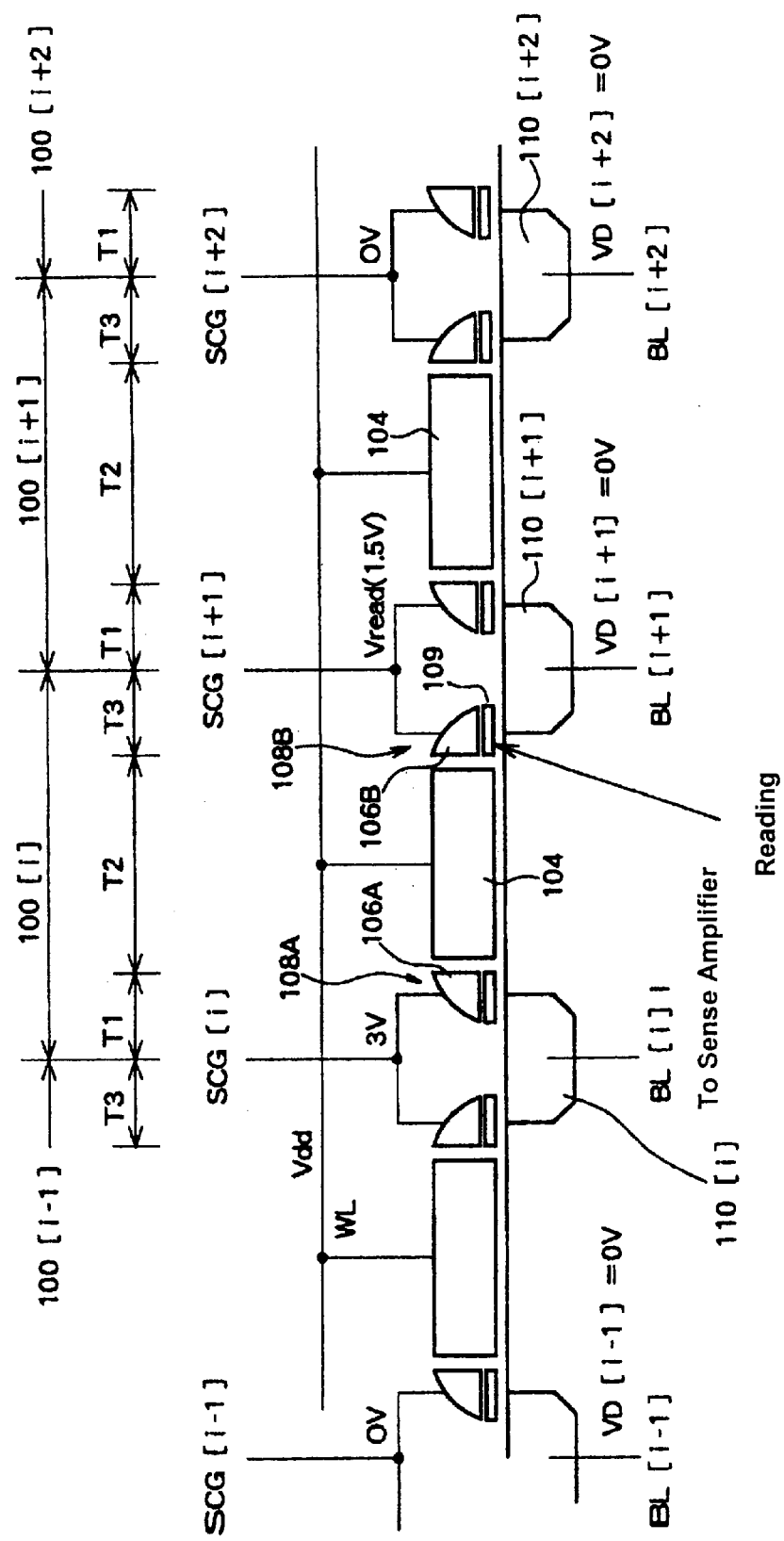
FIG. 9 schematically shows an illustration to be used to describe a data reading operation in the non-volatile semiconductor memory device shown in FIG. 1.
Figure 10:
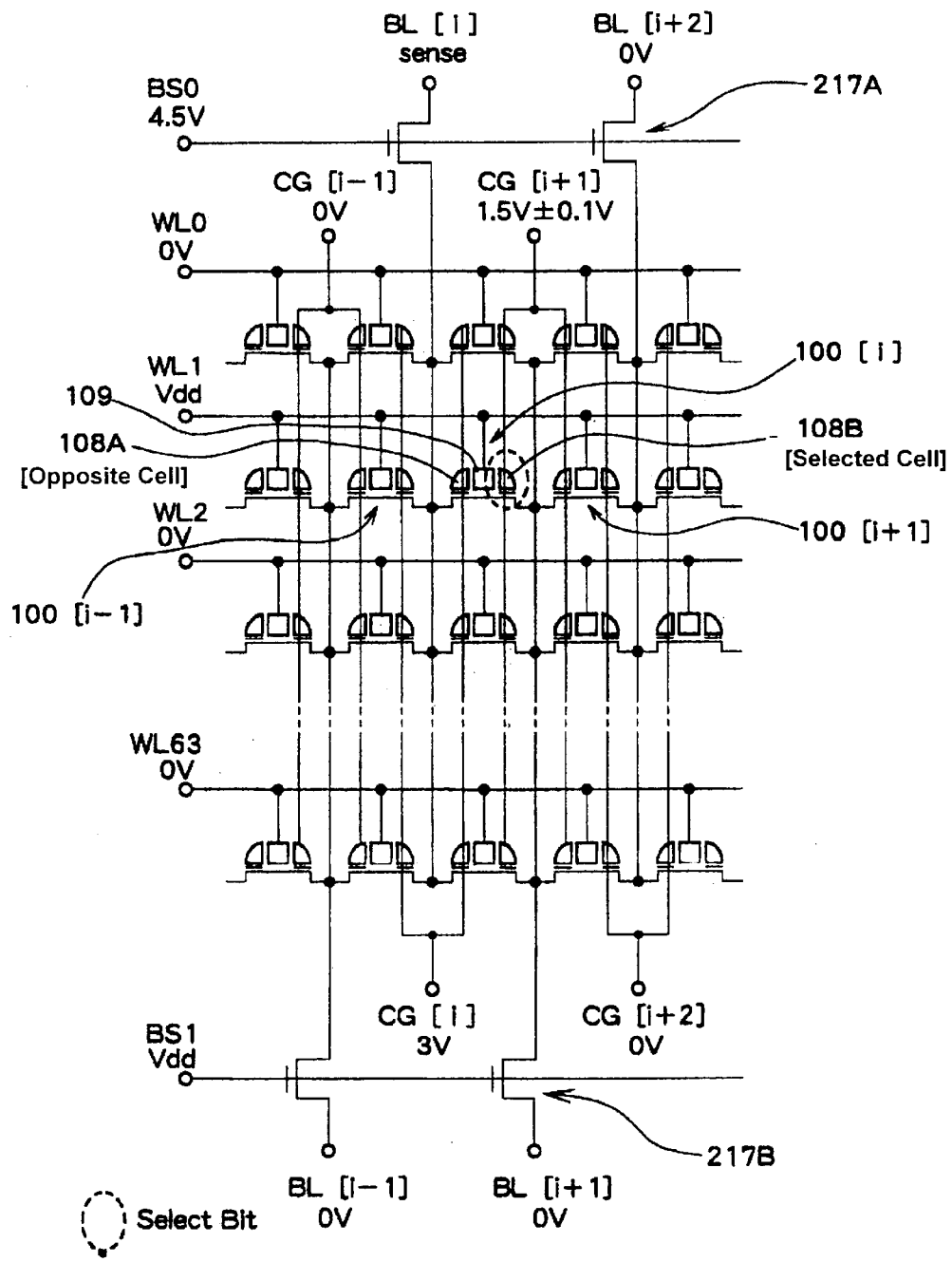
FIG. 10 schematically shows an illustration to be used to describe voltages set in a selected block during data reading.

Before describing the operation of the twin memory cell 100, a description is first made with respect to setting potentials on certain sections of three adjacent twin memory cells 100[i-1], [i], [i+1] and [i+2] in a selected block (a selected small block 215) in, for example, the sector 0. FIG. 9 shows an illustration to be used to describe the case of reading data in a reverse mode from the MONOS memory element 108B (selected cell) on the right side of the word gate 104 of the twin memory cell 100[i] that is connected to the word line WL1, and FIG. 10 shows voltages set at the selected block at that time.

In this case, a read word line selection voltage Vdd (for example, 1.8 V) is applied to the word gate WL1 that is present in the same row as the twin memory cell 100[i], to thereby turn on the transistors T2 on that row. Also, an over-ride voltage (for example, 3 V) is applied through the sub-control gate line SCG[i] to the control gate 106A on the left side (of an opposite cell) of the twin memory cell 100[i] to thereby turn on the transistor T1 that corresponds to the MONOS memory element 108A. A read voltage Vread (for example, 1.5 V) is applied as a voltage VCG of the control gate 106B on the right side of the twin memory cell 100[i].

At this moment, depending on whether or not charge is stored in the MONOS memory element 108B (selected cell) on the right side of the word gate 104, the transistor T3

TABLE 1

| | Selected Block | | | | | | | | |
|---|---|---|---|---|---|---|---|---|---|
| | Selected Twin MONOS Cell | | | | | | Unselected Twin MONOS Cell | | |
| | | | Selected Cell | | Opposite Cell | | | | |
| Mode | BS | WL | BL | CG | BL | CG | WL | BL | CG |
| Read | 4.5 V (Opp. Side) Vdd (Sel. Side) | Vdd | 0 V | 1.5 V ± 0.1 V | sense | 3 V | Vdd or 0 V | sense or 0 V | 3 V or 1.5 V ± 0.1 V or 0 V |
| Program | 8 V | About 1 V | 5 V | 5.5 V | 1 prg = 5 uA (0 to 1 V) | 2.5 V | About 1 V or 0 V | 5 V or Vdd or (0 to IV) | 5.5 V or 2.5 V or 0 V |
| Erase | 8 V | 0 V | 4.5 to 5 V | −1 to −3 V | 4.5 to 5 V | −1 to −3 V | | | |

TABLE 2

| | Opposite Block | | | | Unselected Block | | | |
|---|---|---|---|---|---|---|---|---|
| Mode | BS | WL | BL | CG | BS | WL | BL | CG |
| Read | 4.5 V (Opp. Side) Vdd (Sel. Side) | Vdd or 0 V | 0 V | 0 V | 0 V | 0 V | F | 0 V |
| Program | 8 V | About 1 V or 0 V | 0 V | 0 V | 0 V | 0 V | F | 0 V |
| Erase | 8 V | 0 V | 0 V | 0 V | 0 V | 0 V | F | 0 V |

Based on Table 1 and Table 2, the operation in the respective modes are described below (Reading Data from Memory Cell)

Figure 8:
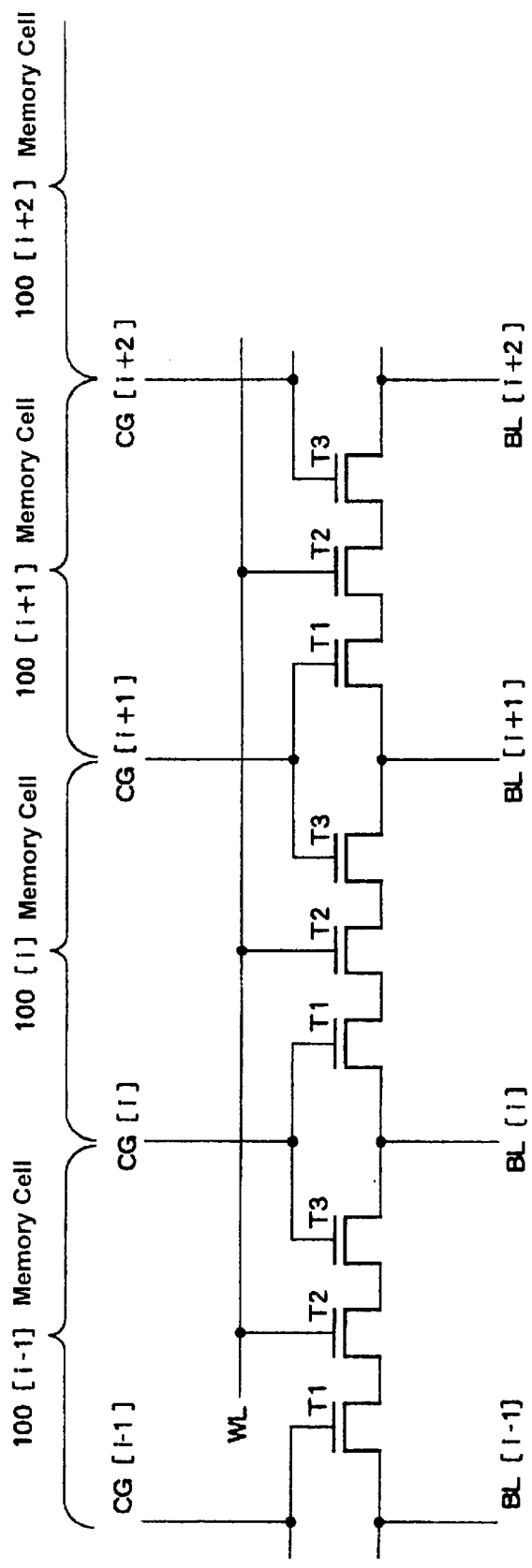
FIG. 8 shows an equivalent circuit of the memory cells shown in FIG. 1.

One twin memory cell 100 can be typified, as shown in FIG. 8, as having a transistor T2 driven by the word gate 104, and transistors T1 and T3 which are respectively driven by the first and second control gates 106A and 106B and which are serially connected to one another.

corresponding to the MONOS memory element 108B operates differently, as follows.

Figure 11:
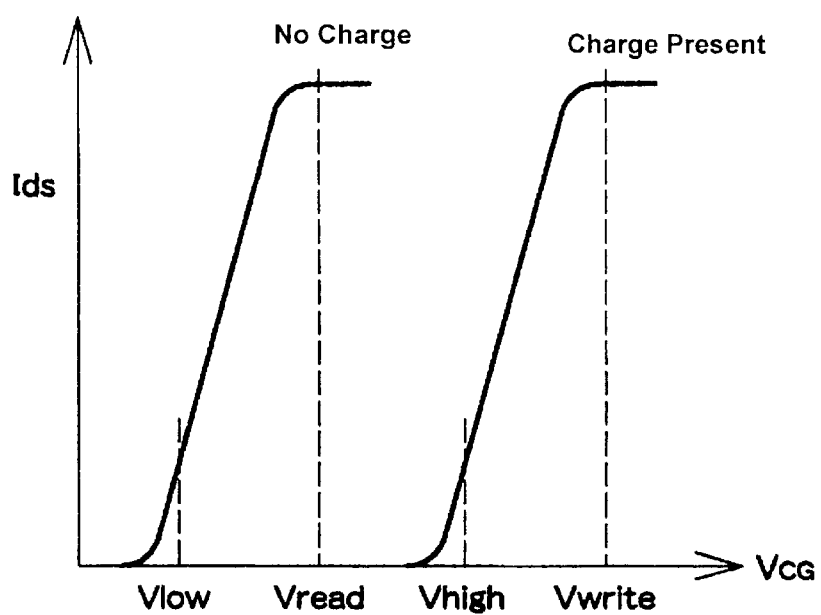
FIG. 11 shows characteristic profiles indicating the relation between control gate voltages VCG and source-drain current Ids in the memory cell shown in FIG. 1.

FIG. 11 shows the relation between voltages applied to the control gate 106B on the right side (the selected cell side) of the twin memory cell 100[i] and currents Ids that flow between the source and the drain of the transistor T3 corresponding to the MONOS memory element 108B (selected cell) controlled by the applied voltages.

As shown in FIG. 11, when charge is not stored in the MONOS memory element 108B (selected cell), the current Ids starts flowing when the control gate voltage VCG exceeds a low threshold voltage Vlow. In contrast, when charge is stored in the MONOS memory element 108B (selected cell), the current Ids does not start flowing unless the control gate potential VCG on the selected side exceeds a high threshold voltage vhigh.

It is noted that the voltage vread, which is applied to the control gate 106B on the selected side when data is read, is set at a substantially intermediate voltage between the two threshold voltages Vlow and Vhigh.

Therefore, when charge is not stored in the MONOS memory element 108B (selected cell), the current Ids flows, and when charge is stored in the MONOS memory element 108B (selected cell), the current Ids does not flow.

Here, as shown in FIG. 10, when data is read, the bit line BL[i] (impurity layer 110[i] connected to the opposite cell is connected to a sense amplifier, and potentials VD[i−1], [i+1] and [i+2] on the other bit lines BL[i−1], [i+1] and [i+2] are set to 0 V, respectively. By doing so, when charge is not stored in the MONOS memory element 108B (selected cell), the current Ids flows, and therefore, for example, a current of 25 $\mu$A or greater flows in the bit line BL[i] on the opposite side through the transistors T1 and T2 that are in ON state. In contrast, when charge is stored in the MONOS memory element 108B (selected cell), the current Ids does not flow. Therefore, even when the transistors T1 and T2 are in ON state, current that flows in the bit line BL[i] on the opposite side is, for example, smaller than 10 nA. Accordingly, by detecting current that flows in the bit line BL[i] on the opposite side by the sense amplifier, data can be read from the MONOS memory element 108B (selected cell) of the twin memory cell 100[i].

In accordance with the present embodiment, as shown in FIG. 10, the bit lines BL[i] and [i+2] are connected to the bit line selection transistor (n-type MOS transistor) 217A, and the bit lines BL[i−1] and [i+1] are connected to the bit line selection transistor 217B.

It is difficult to secure a high current drivability for the selection transistors 217A and 217B due to their size: they have, for example, a channel width w=0.9 $\mu$m and a channel length L=0.8 $\mu$m in the present embodiment.

Since the bit line BL[i] to be connected to the sense amplifier needs to secure the above-mentioned current, the gate voltage of the bit line selection transistor 217A is supplied through a step-up circuit (not shown) such that, for example, a voltage of 4.5 V is supplied to the bit line BL[i].

On the other hand, the voltage on the source side of the MONOS memory element 108A on the selected side becomes a voltage close to 0V (about several tens to one hundred mV). As a result, there is little influence on the back gate of the bit line selection transistor 217B, and therefore its gate voltage is set to Vdd. This gate does not have to be supplied with 4.5 V, and therefore the load to the above-described step-up circuit (charge pump) can be reduced.

It is noted that the voltages shown in Table 1 are set for the unselected cells in the selected block.

Figure 12:
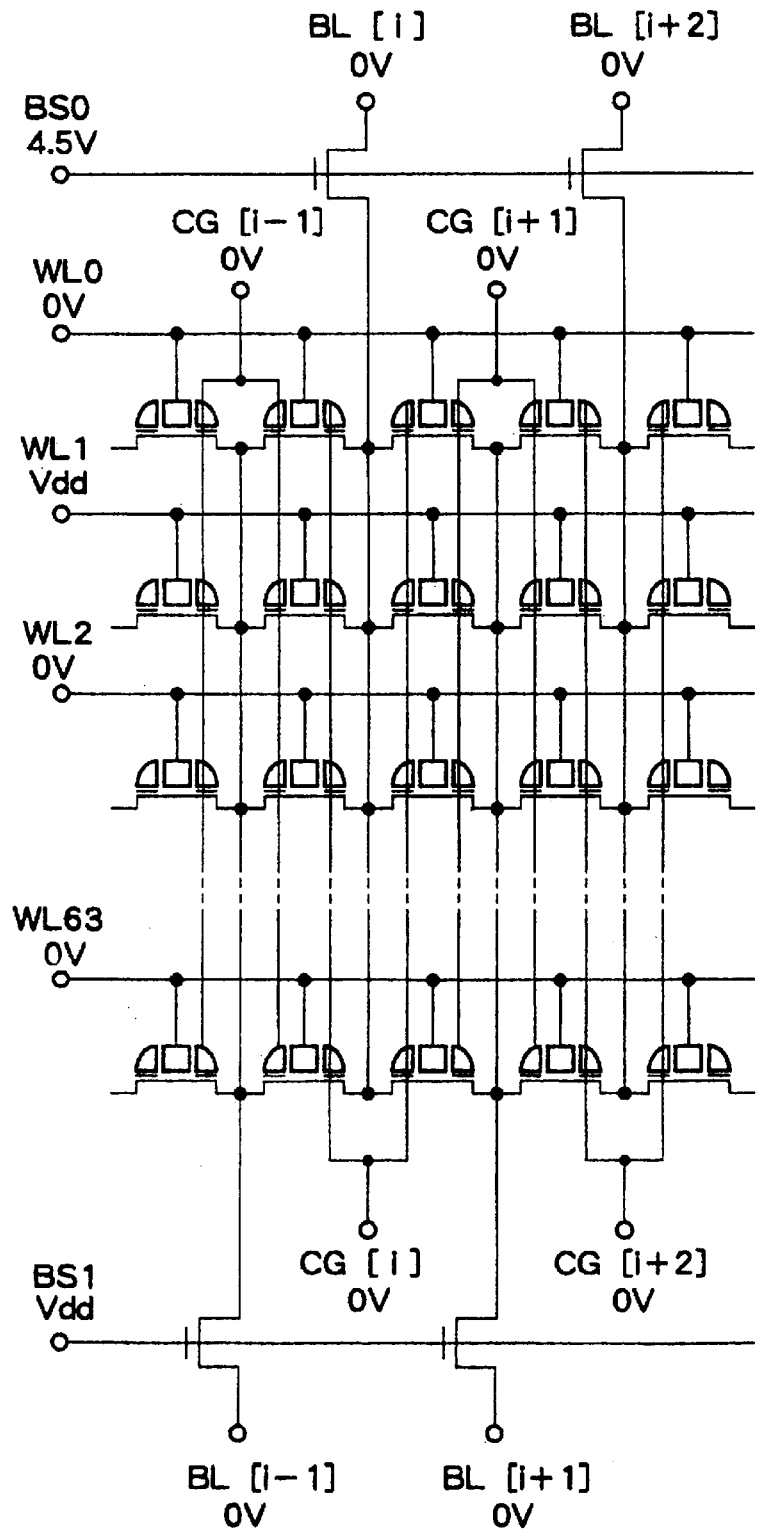
FIG. 12 schematically shows an illustration to be used to describe set voltages in an unselected opposite block during data reading.

Next, voltages according to Table 2 shown above are set for the opposite block (small block 215) in the sector 1 that is opposite to the selected block in the sector 0, the state of which is shown in FIG. 12. Referring to FIG. 12, the voltage of each of the word lines WL and the gate voltage of the bit line selection transistor are commonly used by the sectors 0 and 1, and therefore have the same settings as in the selected block shown in FIG. 10. All of the bit lines are set at 0 V.

Figure 13:
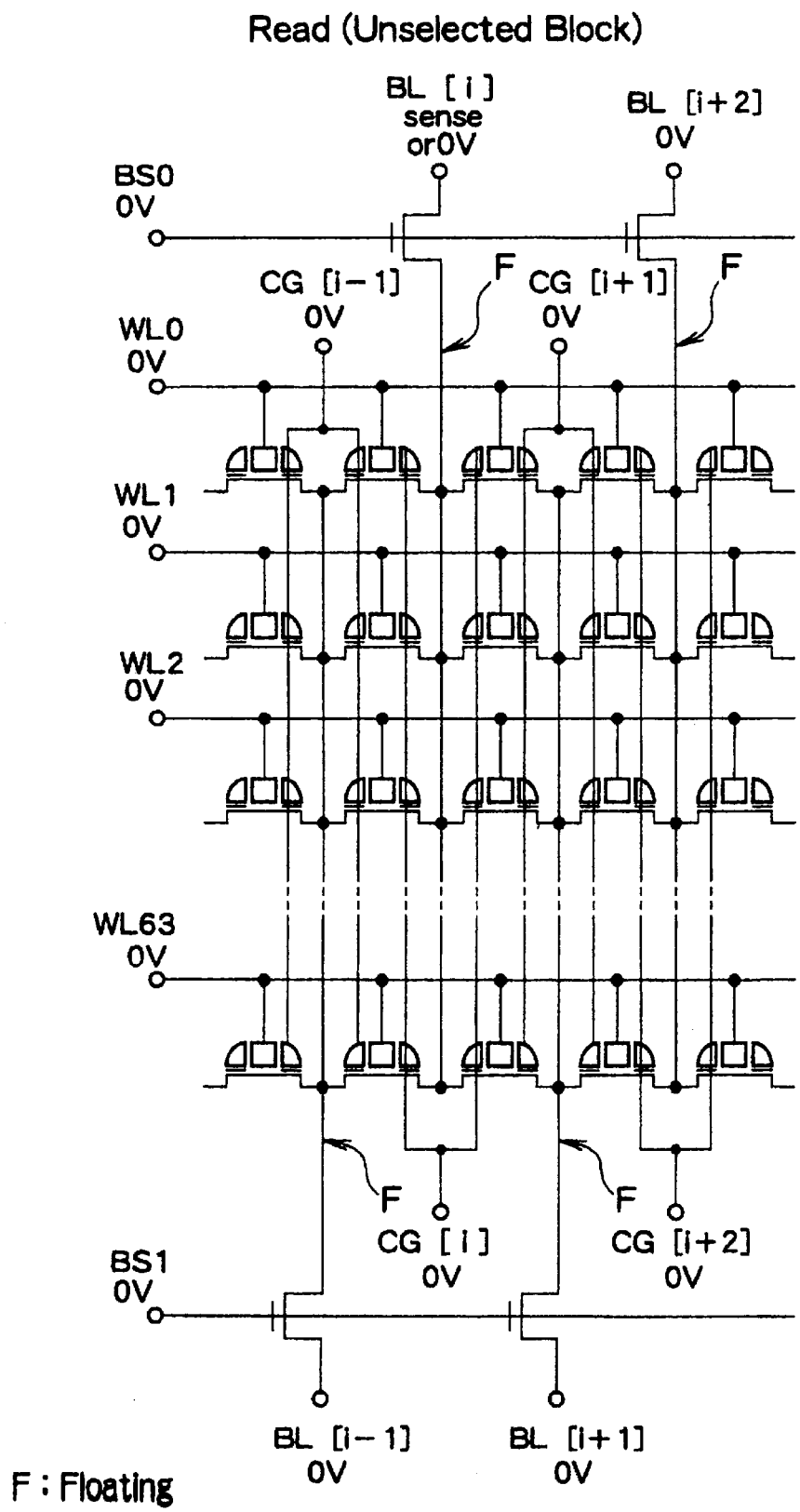
FIG. 13 schematically shows an illustration to be used to describe set voltages in unselected blocks other than the opposite block during data reading.

Voltages according to Table 2 shown above are set for the unselected blocks (small blocks 215) that are present in the sectors 0 to 63 other than the selected block and the opposite block, the state of which is shown in FIG. 13.

In the unselected blocks, the gate voltage of the bit line selection transistors 217A and 217B, the word lines WL, and the control gate lines CG are all set at 0 V. Since the bit line selection transistors 217A and 217B are turned OFF, the bit lines BL are in a floating state.

(Programming of Memory Cell)

Figure 14:
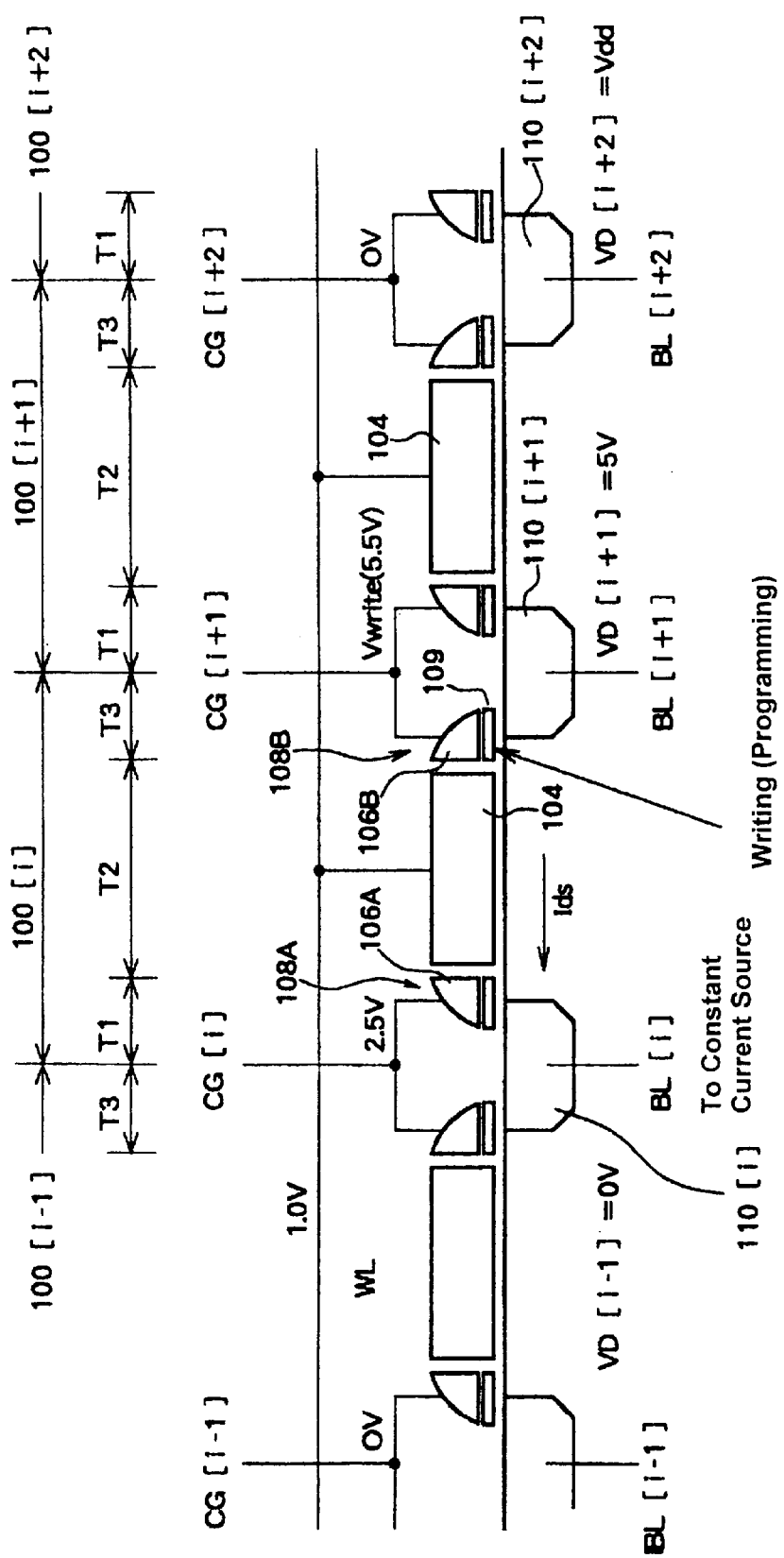
FIG. 14 schematically shows an illustration to be used to describe a data writing (programming) operation in the non-volatile semiconductor memory device shown in FIG. 1.
Figure 15:
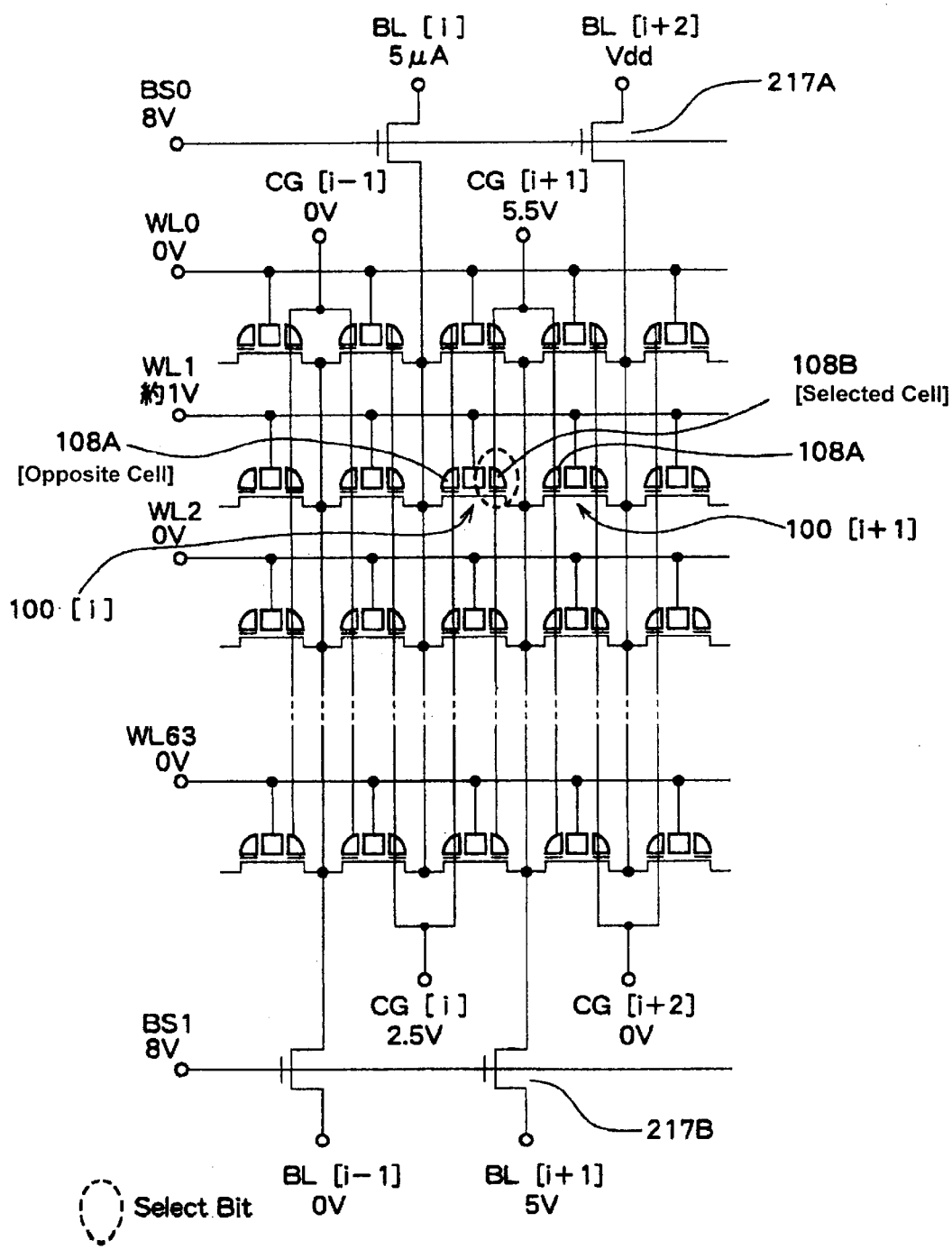
FIG. 15 schematically shows an illustration to be used to describe set voltages in a selected block during data programming.

FIG. 14 shows an illustration to be used to describe data programming for the MONOS memory element 108B (selected cell) on the right side of the word gate 104 of the twin memory cell 100[i] that is connected to the word line WL1. FIG. 15 shows voltages set in the selected block. Before the data programming operation, a data erasing operation to be described below is conducted.

Referring to FIG. 14, a potential on the sub-control gate line SCG[i] is an over-ride potential (for example, 2.5 V), which is the same as that shown in FIG. 9, and potentials on the sub-control gate lines SCG[i−1] and [i+2] are at 0 V. It is noted that the "over-ride potential" is a potential that is required to turn on the transistor T1 corresponding to the MONOS memory element 108A so that a program current flows without regard to the presence or the absence of programming of the MONOS memory element 108A (element on the opposite side of the selected side element) on the left side of the twin memory cell 100[i]. Also, a potential on each of the word gates 104 in FIG. 15 is set by the word line WL1 at a programming word line selection voltage of, for example, about 1.0 V that is lower than the power supply voltage Vdd. Also, a potential on the control gate 108B (selected cell) on the right side of the twin memory cell 100[i+1] is set through the sub-control gate line SCG[i+1] at a writing voltage Vwrite (for example, 5.5 V) shown in FIG. 4, which is a programming control gate voltage.

Figure 16:
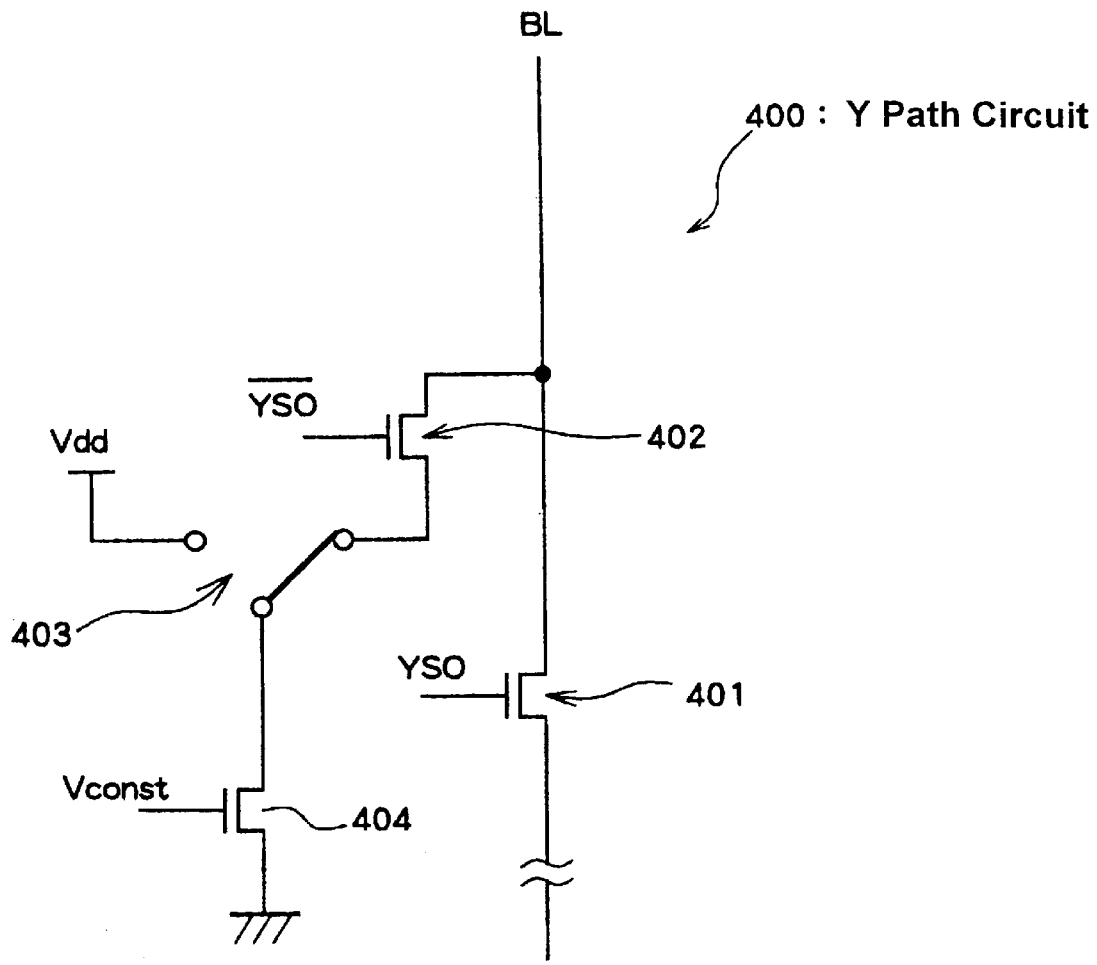
FIG. 16 schematically shows a circuit diagram of a Y path connected to the bit line.

Next, setting of voltages on the bit line BL is described with reference to FIG. 16. FIG. 16 schematically shows the interior of a Y path circuit 400 that is connected to the bit my line BL.

A first transistor 401 for connecting the bit line BL to a sense amplifier or a bit line driver, and a second transistor 402 for connecting the bit line BL to a path other than the above are provided in the Y path circuit 400. Opposite signals YS0 and /YS0 are input to the gates of the first and second transistors 401 and 402, respectively.

A power supply voltage Vdd (1.8 V) and a constant current to source 404 that provides a constant current of, for example, 5 $\mu$A are provided for the source of the second transistor 402 through a switch 403.

Upon programming, the voltage VD[i+1] on the bit line BL[i+1] shown in FIG. 14 and FIG. 15 is connected to the bit line driver through the transistor 401 shown in FIG. 16, such that it is set at a programming bit line voltage, for example, at 5 V.

Also, the bit line BL[i+2] is set at Vdd through the transistor 402 and the switch 403 shown in FIG. 16.

Both of the bit lines BL[i−1] and [i] are connected to the constant current source 404 through the second transistor 402 and the switch 403 shown in FIG. 16. However, the MONOS cell that is connected to the bit line BL[i−1], with its control gate line CG[i−1] being at 0V, and therefore being in an OFF state in which current does not flow is set to 0 V through the constant current source 404.

As a result, the transistors T1 and T2 of the twin memory cell 100[i] turn on, such that the current Ids flows toward the bit line BL[i], and on the other hand, channel hot electrons (CHE) are trapped in the ONO film 109 of the MONOS memory element 108B. In this manner, a programming operation for the MONOS memory element 108B is conducted, with the result that data "0" or "1" is written.

In an alternative method, instead of about 1 V, the programming word line selection voltage may be set to about 0.77 V, to set the bit line BL[i] to be at 0 V. In the present embodiment, although the programming word line selection voltage is raised to about 1 V to increase the source-drain current, the current that may flow in the bit line BL[i] during programming is restricted by the constant current source 404. As a result, the voltage on the bit line BL[i] can be optimally set (in a range of 0 to 1 V, and at about 0.7 V in the present embodiment), and the programming operation can be optimally performed.

As a result of the operation described above, a voltage of 5.5 V is also applied to the control gate of the non-volatile memory element 108A on the right side of the unselected twin memory cell 100[i+1]. At this moment, since the control gate CG[i+2] on the right side of the twin memory cell 100[i+1] is at 0 V, current does not intrinsically flow between the source and the drain of the twin memory cell 100[i+1] (between the bit lines). However, since a voltage of 5 V is applied to the bit line BL[i+1], a punch-through current flows and write-disturbance occurs when a high electric field is applied between the source and the drain (between the bit lines) of the twin memory cell 100[i+1]. Accordingly, the voltage on the bit line BL[i+2] is set to, for example, Vdd, instead of 0 V, to thereby reduce the potential difference between the source and the drain to prevent write-disturbance. Also, the voltage on the bit line BL[i+2] may be set to a voltage exceeding 0 V, and may preferably be set equal to or greater than the word line selection voltage during programming. As a result, the transistor T2 of the memory cell [i+1] becomes difficult to turn on, such that disturbance is also prevented.

Also, because a voltage of 5 V needs to be supplied to the bit line BL[i+1], a voltage of 8 V is applied to the gate of the bit line selection transistor 217B. In the mean time, a voltage of 8 V is likewise applied to the gate of the bit line selection transistor 217B. Because the bit line BL[i+2] is required to be set to Vdd for the reasons described above, and therefore a high voltage higher than Vdd also needs to be applied to the gate of the transistor 217A, a voltage of 8 V that is the same as the gate voltage of the transistor 217B is used. It is noted that a gate voltage of the bit line selection transistor 217A higher than Vdd+Vth may suffice.

It is noted that voltages according to Table 1 are set for the unselected cells in the selected block.

Figure 17:
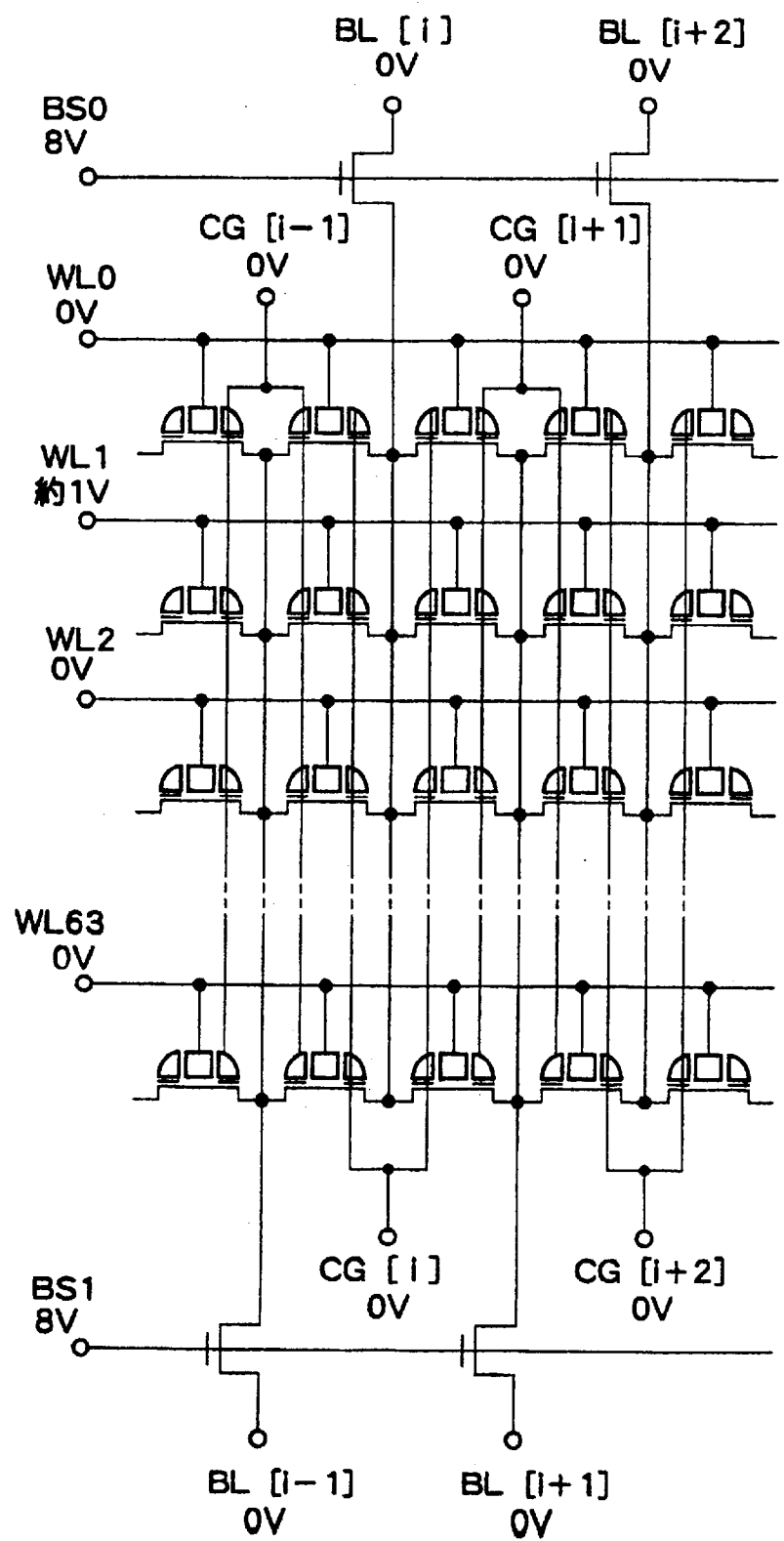
FIG. 17 schematically shows an illustration to be used to describe set voltages in an unselected opposite block during data programming.

Next, voltages according to Table 2 shown above are set for the opposite block (small block 215) in the sector 1 opposite to the selected block in the sector 0, the state of which is shown in FIG. 17. Referring to FIG. 17, the voltage of each of the word lines WL and the gate voltage of the bit line selection transistor are commonly used by the sectors 0 and 1, and therefore have the same settings as in the selected block shown in FIG. 14. All of the bit lines are set to 0 V.

Figure 18:
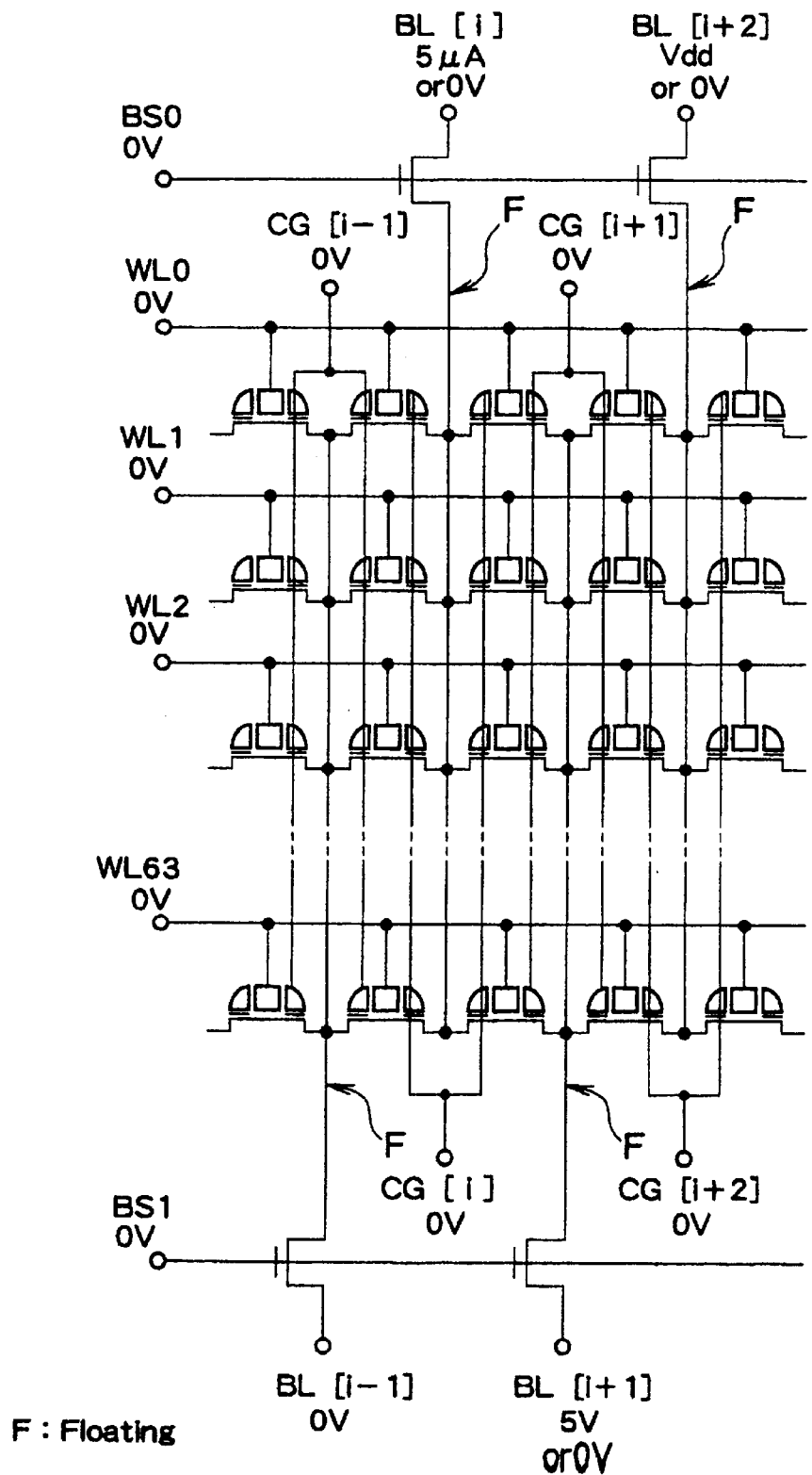
FIG. 18 schematically shows an illustration to be used to describe set voltages in unselected blocks other than the opposite block during data programming.

Voltages according to Table 2 shown above are set for the unselected blocks (small blocks 215) that are present in the sectors 0 to 63 other than the selected block and the opposite block, the state of which is shown in FIG. 18.

In the unselected blocks, the gate voltage of the bit line selection transistors 217A and 217B, the word lines WL, and the control gate lines CG are all set at 0 V. Since the bit line selection transistors 217A and 217B are turned OFF, the bit lines BL are in a floating state.

Figure 19:
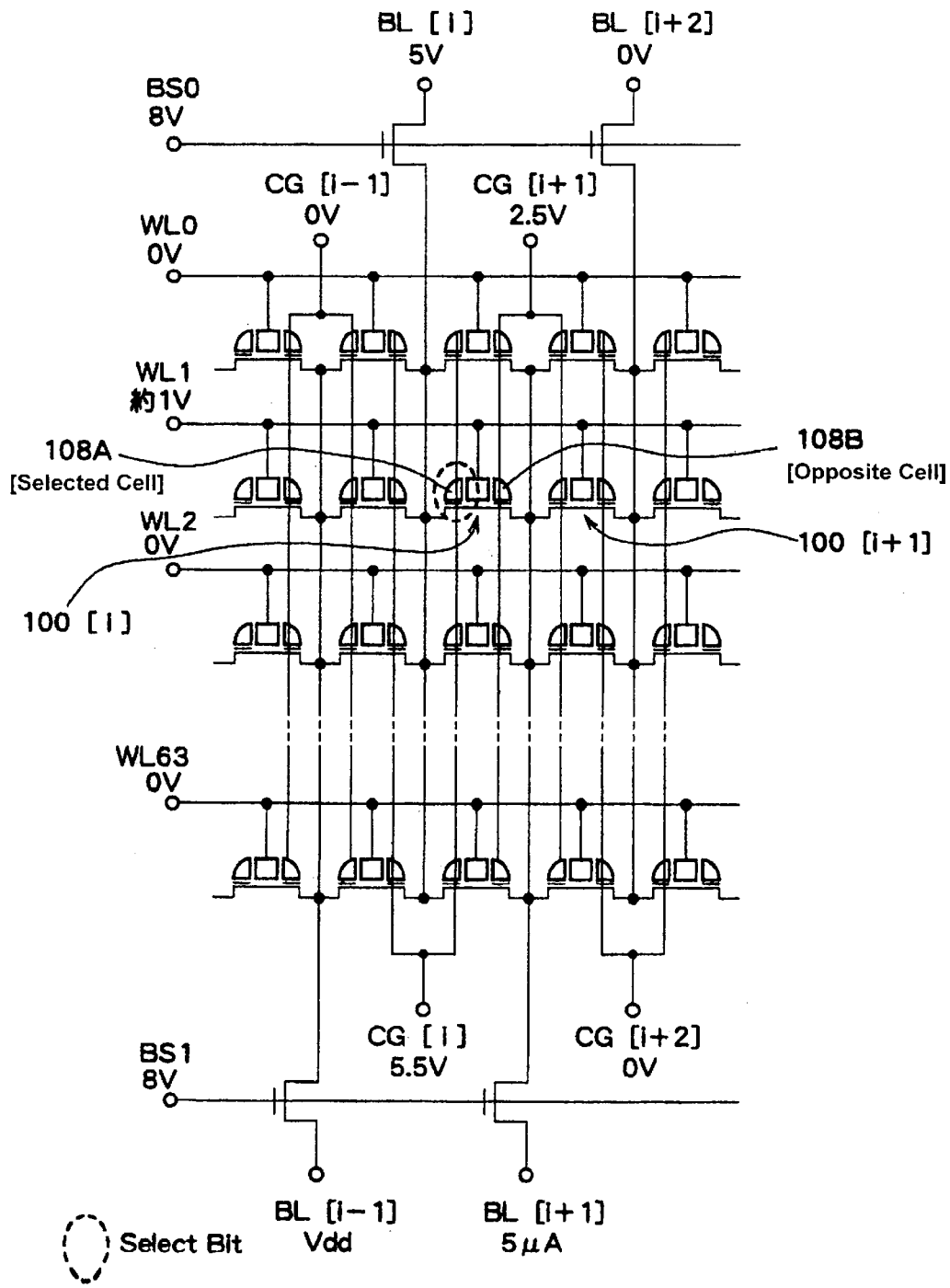
FIG. 19 schematically shows an illustration to be used to describe set voltages in a selected block during data programming with respect to memory elements on the selected side different from those shown in FIG. 15.

To program the MONOS memory element 108A on the left side of the twin memory cell 100[i], potentials at certain sections of the twin memory cells 100[i−1], [i] and [i+1] may be set as shown in FIG. 19.

Figure 20:
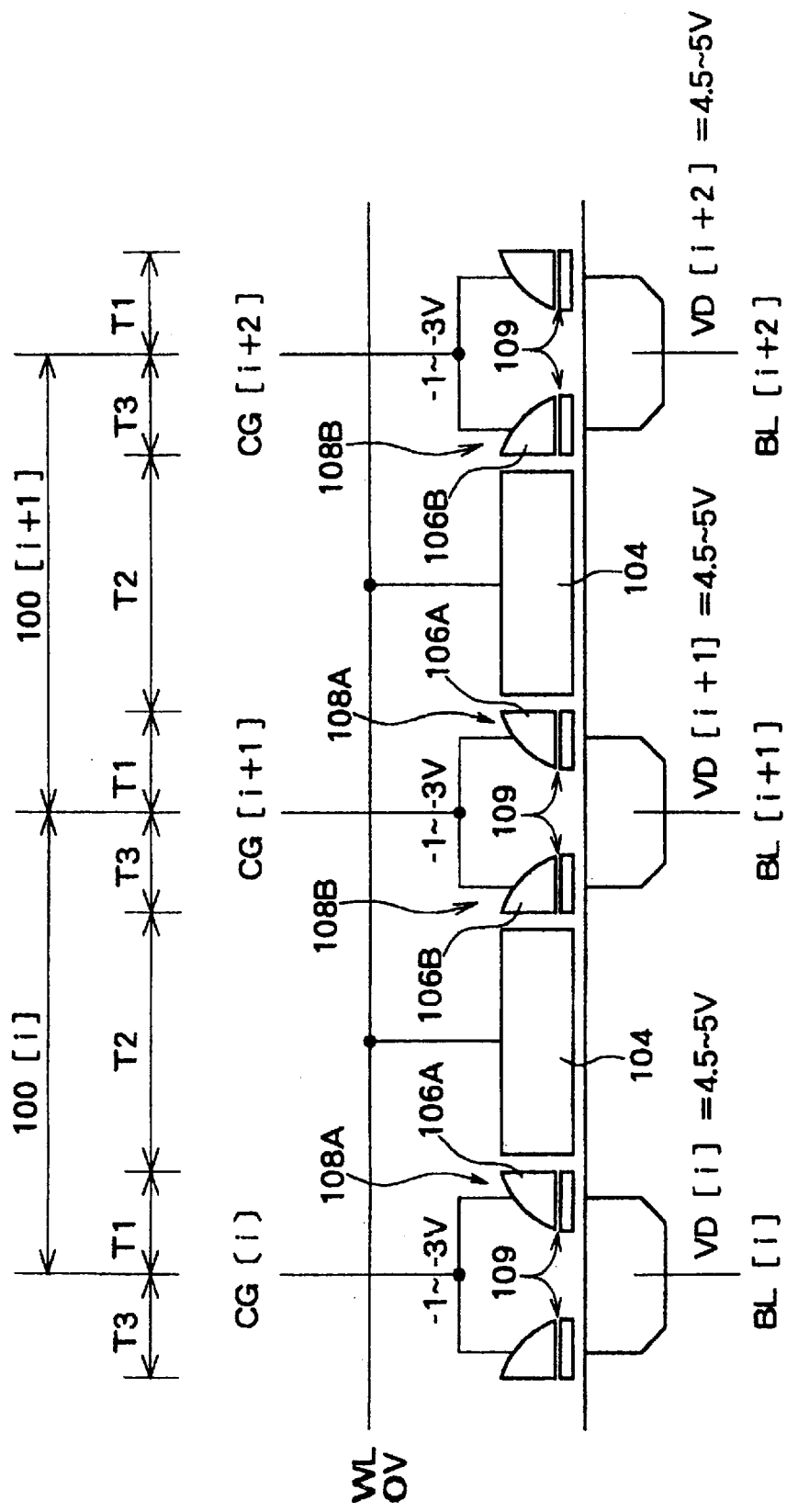
FIG. 20 schematically shows an illustration to be used to describe a data erasing operation in the non-volatile semiconductor memory device shown in FIG. 1.
Figure 21:
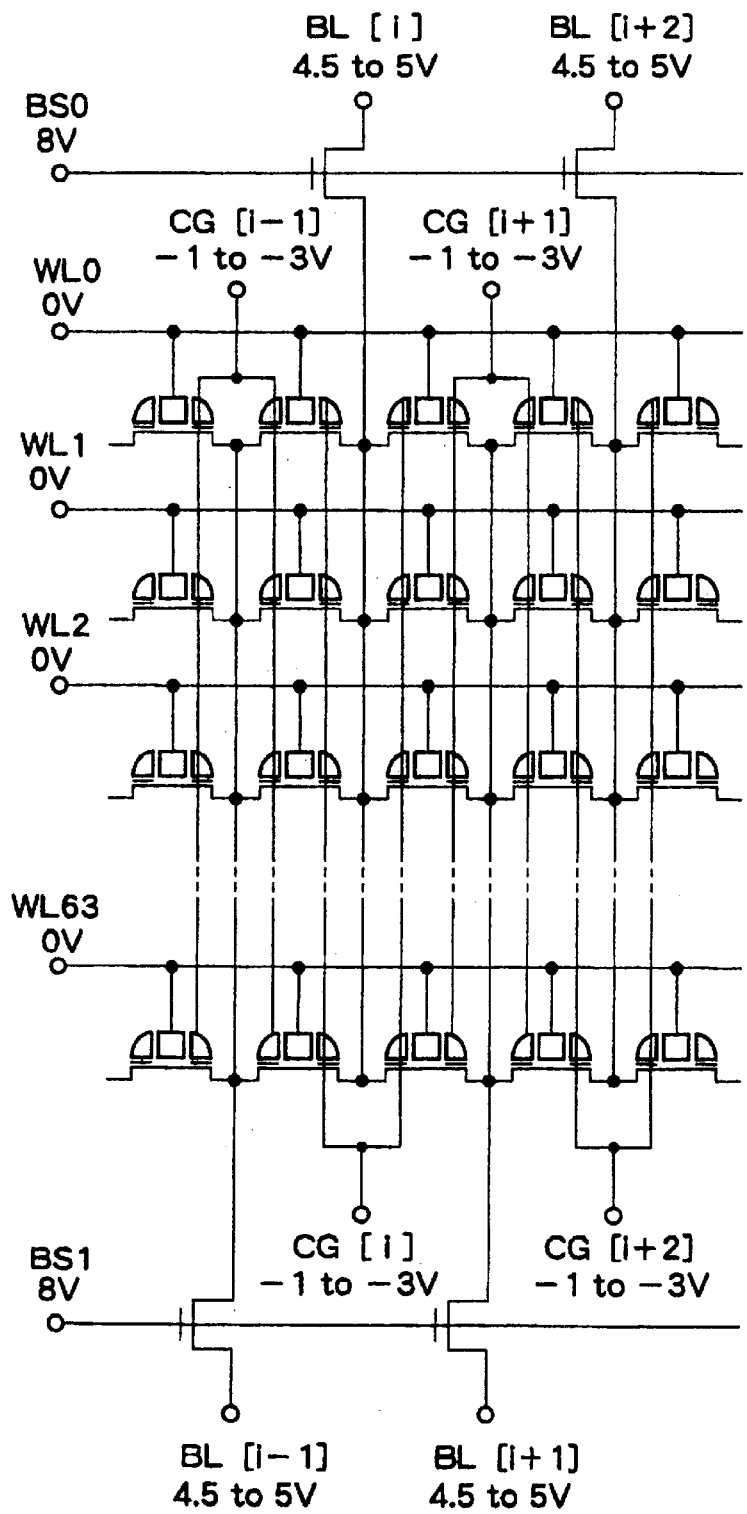
FIG. 21 schematically shows an illustration to be used to describe set voltages in a selected block at the time of data erasing.

(Erasing Data in Memory Cell) FIG. 20 schematically shows an illustration used to describe erasing data in all the memory cells in the sector 0 in one lot, and FIG. 21 shows the state of set voltages for memory cells in a part of the sector 0.

Referring to FIG. 20, the potential of each of the word gates 104 is set to 0 V by the word line WL, and the potential of the control gates 106A and 106B is set at an erasing control gate line voltage that is, for example, about −1 to −3 V by the sub-control gate lines SCG[i−1], [i], [i+1], and [i+2]. Furthermore, the potential of each of the bit lines BL[i−1], [i], [i+1], and [i+2] is set to an erasing bit line voltage that is, for example, 4.5 V to 5 V by the bit line selection transistors 217A and 217B, and the bit line driver.

As a result, electrons trapped in the ONO film 109 of each of the MONOS memory elements 108a and 108B are extracted by the tunnel effect and erased by the erasing control gate voltage applied to the control gates and the erasing bit line voltage applied to the bit lines. By this, data at the plurality of twin memory cells can be simultaneously erased. It is noted that, according to another erasing operation different from the one described above, hot-holes maybe formed in the band-band tunneling at the surface of the impurity layer that defines bits to thereby erase the stored electrons.

Also, without being limited to the one in which data in the sector is erased in one lot, data can be erased in a time division manner.

Figure 22:
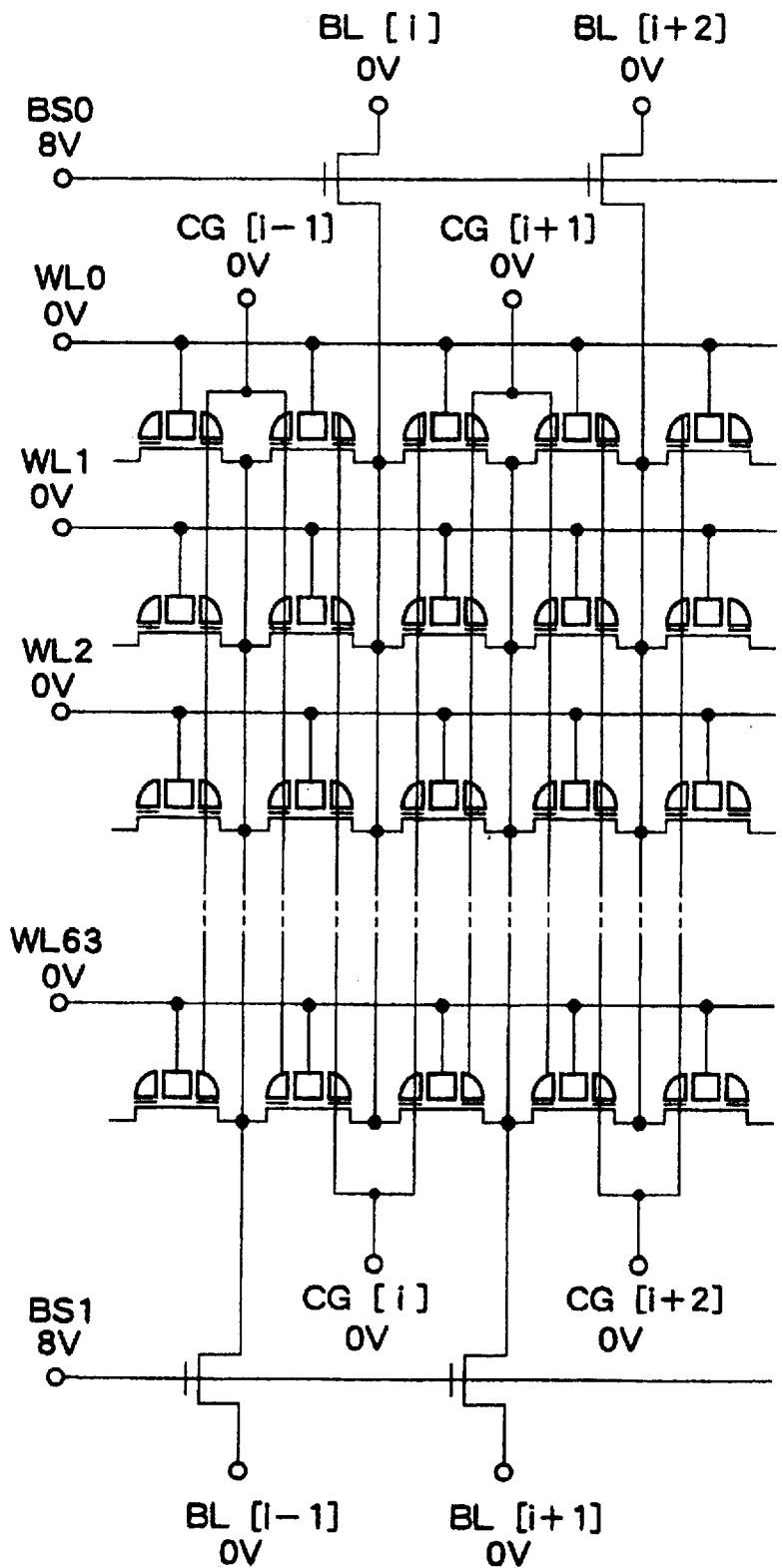
FIG. 22 schematically shows an illustration to be used to describe set voltages in an unselected opposite block at the time of data erasing.

Next, voltages according to Table 2 shown above are set for the opposite block (small block 215) in the sector 1 that is opposite to the selected block in the sector 0, the state of which is shown in FIG. 22. Referring to FIG. 22, the voltage of each of the word lines WL and the gate voltage of the bit line selection transistor are commonly used by the sectors 0 and 1, and therefore have the same settings as in the selected block shown in FIG. 18. All of the bit lines are set to 0 V. In each of the cells in the opposite block, both of the control gate lines CG and the bit lines BL are at 0 V, and therefore disturbance does not occur.

Figure 23:
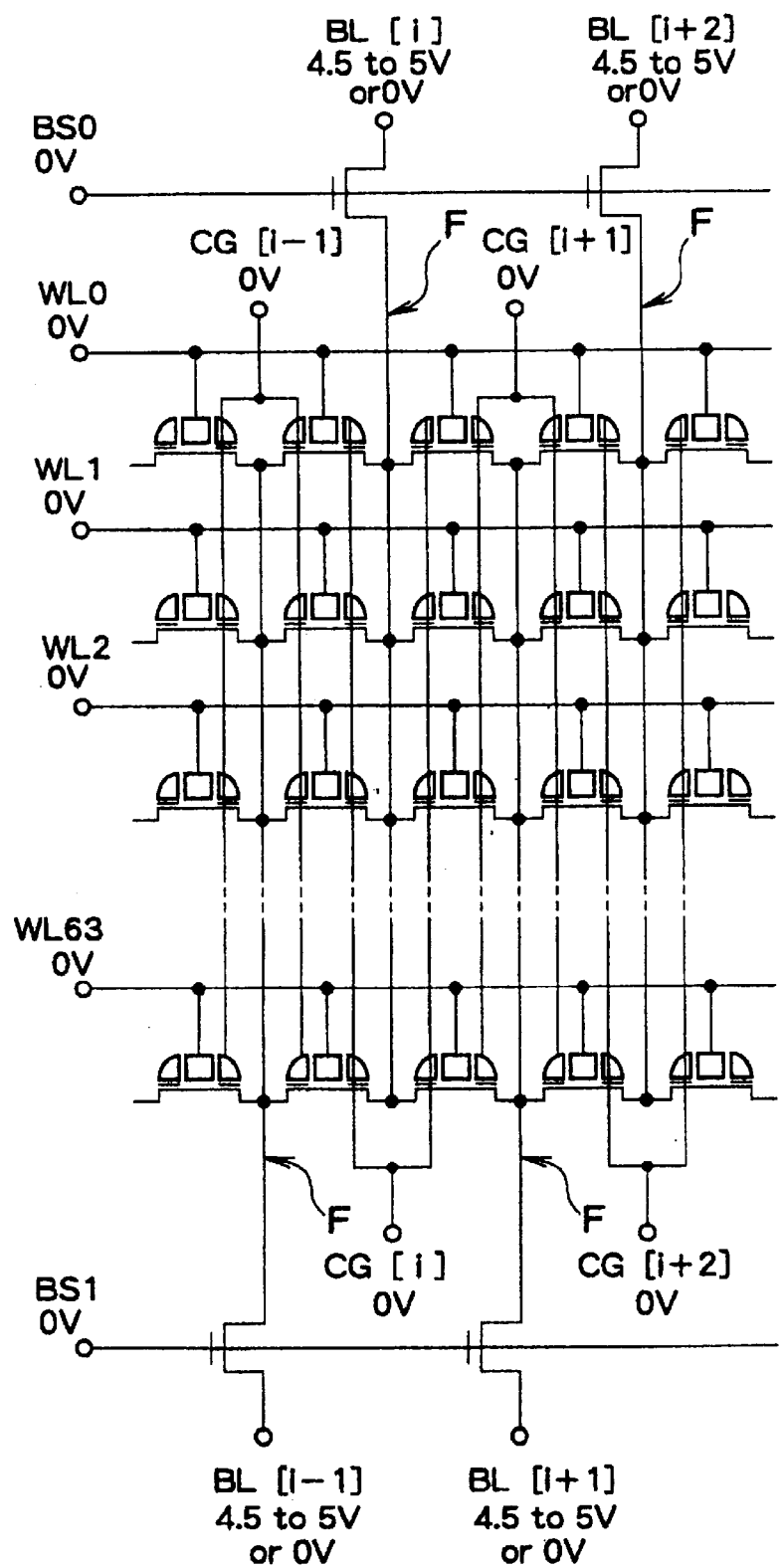
FIG. 23 schematically shows an illustration to be used to describe set voltages in unselected blocks other than the opposite block at the time of data erasing.

Voltages according to Table 2 shown above are set for the unselected blocks (small blocks 215) that are present in the sectors 0 to 63 other than the selected block and the opposite block, the state of which is shown in FIG. 23.

In the unselected blocks, the gate voltage of the bit line selection transistors 217A and 217B, the word lines WL, and the control gate lines CG are all set to 0 V. Since the bit line selection transistors 217A and 217B are turned OFF, the bit lines BL are in a floating state. However, since the voltage on the bit lines BL is a voltage that is very close to almost 0 V, disturb does not occur in the cells in the unselected blocks.

It is noted that the present invention is not limited to the embodiments described above, and many modifications can be made within the scope of the subject matter of the present invention.

For example, the structure of the non-volatile memory elements 108A and 108B is not limited to the MONOS structure. The present invention can also be applied to a non-volatile semiconductor memory device using other types of twin memory cells in which charges can be trapped independently at two locations, using one word gate 104 and first and second control gates 106A and 106B.

Also, in the embodiment described above, one example is described with respect to the number of divisions of sector regions, the number of divisions of large blocks and small blocks, and the number of memory cells in each small memory block, and many type of modifications can be made. It is noted that the number of divisions for the large blocks is eight due to the restrictions imposed on the metal wiring pitch. If the metal wiring pitch can be made smaller, the number of divisions can be further increased. For example, when it is divided into sixteen blocks, the load capacitor (gate capacitor) of each one of the control gate lines is further reduced, and a higher driving speed can be achieved. However, it is noted that when it is divided into sixteen blocks, the number of main control gate lines increases. Accordingly, the lines and spaces have to be narrowed or the area has to be increased. Also, the number of control gate drivers increases, and the area is accordingly increased.

What is claimed is:

1. A programming method for a non-volatile semiconductor memory device in which a plurality of twin memory cells, each having one word gate and first and second non-volatile memory elements controlled by first and second control gates, are arranged and, from among three adjacent twin memory cells (i−1), (i) and (i+1) whose word gates are connected to one word line, data for the second non-volatile memory element of the twin memory cell (i) is programmed, said method comprising:

setting the word line to a programming word line selection voltage;

setting the second control gate of the twin memory cell (i) and the first control gate of the twin memory cell (i+1) to a programming control gate voltage;

setting the second control gate of the twin memory cell (i−1) and the first control gate of the twin memory cell (i) to an over-ride voltage;

setting a bit line commonly connected to the second non-volatile memory element of the twin memory cell (i) and the first non-volatile memory element of the twin memory cell (i+1) to a programming bit line voltage; and connecting a bit line that is commonly connected to the second non-volatile memory element of the twin memory cell (i−1) and the first non-volatile memory element of the twin memory cell (i) to a constant current source.

2. The programming method for a non-volatile semiconductor memory device according to claim 1, wherein the programming word line selection voltage is set to a voltage that is high enough to be able to cause a current greater than a current provided by the constant current source to flow between a source and a drain of the twin memory cell including the non-volatile memory element to be programmed.

3. The programming method for a non-volatile semiconductor memory device according to claim 1, wherein each of the first and second non-volatile memory elements includes an ONO film formed from an oxide film (O), a nitride film (N), and an oxide film (O) as a charge trap site, wherein data is programmed at the trap site.

4. A programming method for a non-volatile semiconductor memory device in which a plurality of twin memory cells, each having one word gate and first and second non-volatile memory elements controlled by first and second control gates, are arranged and, from among three adjacent twin memory cells (i−1), (i) and (i+1) whose word gates are connected to one word line, data for the first non-volatile memory element of the twin memory cell (i) is programmed, said method comprising:

setting the word line to a programming word line selection voltage;

setting the second control gate of the twin memory cell (i−1) and the first control gate of the twin memory cell (i) to a programming control gate voltage;

setting the second control gate of the twin memory cell (i) and the first control gate of the twin memory cell (i+1) to an over-ride voltage;

setting a bit line commonly connected to the second non-volatile memory element of the twin memory cell (i−1) and the first non-volatile memory element of the twin memory cell (i) to a programming bit line voltage; and connecting a bit line that is commonly connected to the second non-volatile memory element of the twin memory cell (i) and the first non-volatile memory element of the twin memory cell (i+1) to a constant current source.

5. The programming method for a non-volatile semiconductor memory device according to claim 4, wherein the programming word line selection voltage is set to a voltage that is high enough to be able to cause a current greater than a current provided by the constant current source to flow between a source and a drain of the twin memory cell including the non-volatile memory element to be programmed.

6. The programming method for a non-volatile semiconductor memory device according to claim 4, wherein each of the first and second non-volatile memory elements includes an ONO film formed from an oxide film (O), a nitride film (N), and an oxide film (O) as a charge trap site, wherein data is programmed at the trap site.

* * * * *